(12) United States Patent
Liaw

(10) Patent No.: US 12,154,959 B2
(45) Date of Patent: Nov. 26, 2024

(54) GATE-ALL-AROUND STRUCTURES AND MANUFACTURING METHOD THEREOF

(71) Applicant: Taiwan Semiconductor Manufacturing Company, Ltd., Hsinchu (TW)

(72) Inventor: Jhon Jhy Liaw, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 491 days.

(21) Appl. No.: 17/446,233

(22) Filed: Aug. 27, 2021

(65) Prior Publication Data

US 2022/0328641 A1    Oct. 13, 2022

Related U.S. Application Data

(60) Provisional application No. 63/173,139, filed on Apr. 9, 2021.

(51) Int. Cl.
| | |
|---|---|
| *H01L 29/423* | (2006.01) |
| *H01L 29/66* | (2006.01) |
| *H01L 29/786* | (2006.01) |

(52) U.S. Cl.
CPC .... *H01L 29/42392* (2013.01); *H01L 29/6675* (2013.01); *H01L 29/78618* (2013.01)

(58) Field of Classification Search
CPC ........... H01L 29/42392; H01L 29/6675; H01L 29/78618; H01L 21/823814; H01L 21/82385; H01L 21/823864; H01L 27/092; H01L 29/0847; H01L 29/165; H01L 29/167; H01L 29/0673; H01L 29/775; H01L 29/66439; H01L 29/78696; H01L 21/823431; H01L 21/823418; H01L 21/823456; H01L 21/823481; H01L 27/0886; B82Y 10/00
See application file for complete search history.

(56) References Cited

U.S. PATENT DOCUMENTS

| | | | |
|---|---|---|---|
| 10,332,819 B1 | 6/2019 | Liaw | |
| 2020/0097632 A1* | 3/2020 | Lin | ...................... H01L 27/0886 |
| 2020/0105889 A1* | 4/2020 | Liaw | ............... H01L 21/823418 |
| 2020/0161419 A1* | 5/2020 | Yang | ................. H01L 29/66545 |
| 2020/0243520 A1* | 7/2020 | Chang | ............... H01L 29/66545 |
| 2022/0115531 A1* | 4/2022 | Jeong | .............. H01L 21/823807 |

* cited by examiner

*Primary Examiner* — Mohammad A Rahman
(74) *Attorney, Agent, or Firm* — Harrity & Harrity, LLP

(57) ABSTRACT

Some implementations described herein provide a semiconductor device that includes a first set of gate-all-around (GAA) structures, having a first gate pitch, that includes a first set of source/drains having a first source/drain width and a first set of top spacers, having a first spacer width, disposed between a first set of gates of the first set of GAA structures and the first set of source/drains. The semiconductor device includes a second set of GAA structures having a second gate pitch, that, includes a second set of source/drains having a second source/drain width and a second set of top spacers, having a second spacer width, disposed between a second set of gates of the second set of GAA structures and the second set of source/drains.

20 Claims, 19 Drawing Sheets

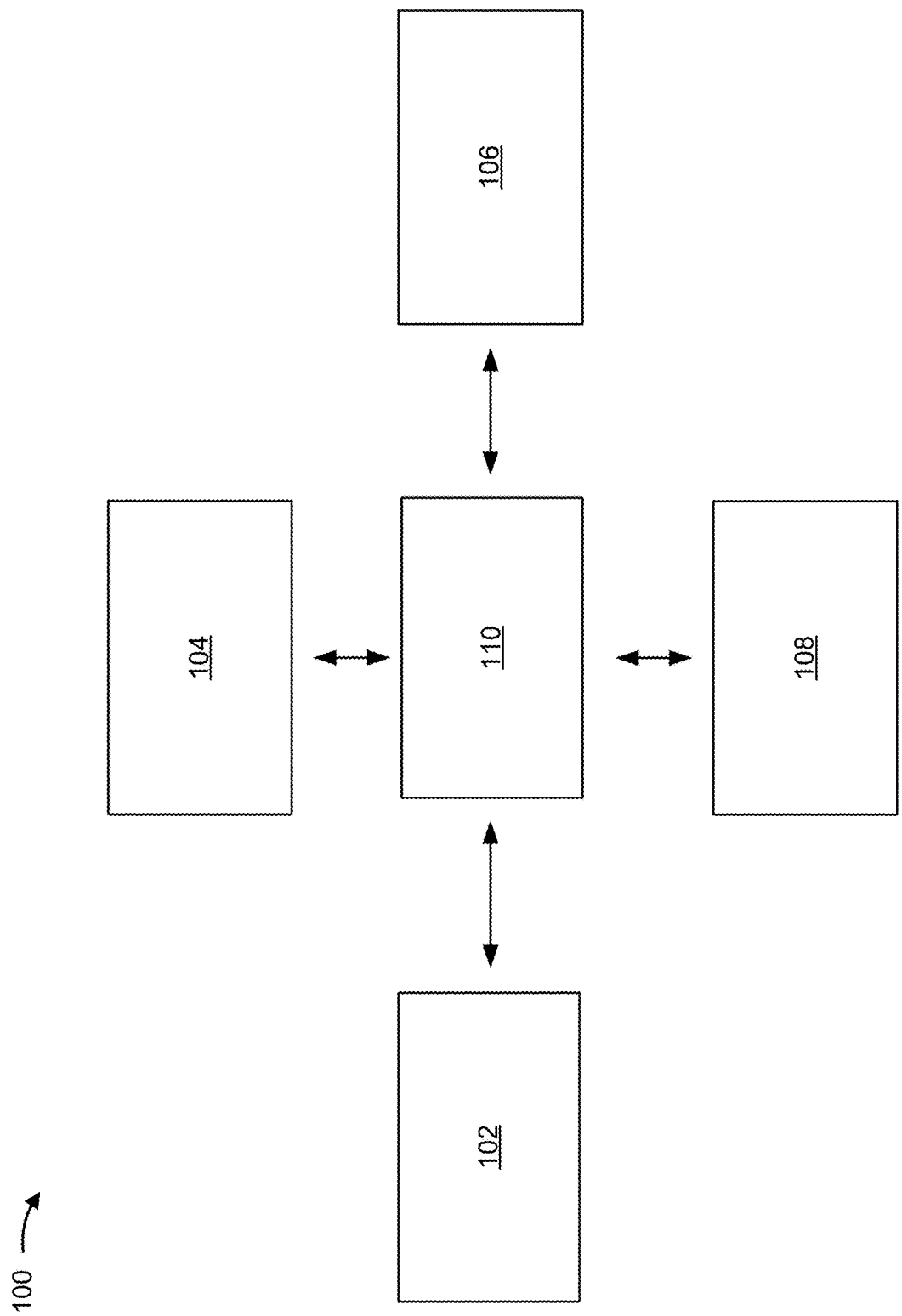

GATE-ALL-AROUND STRUCTURES AND MANUFACTURING METHOD THEREOF

CROSS-REFERENCE TO RELATED APPLICATION

This Patent Applications claims priority to U.S. Provisional Patent Application No. 63/173,139, filed on Apr. 9, 2021, and entitled "GATE-ALL-AROUND STRUCTURE AND MANUFACTURING METHOD THEREOF." The disclosure of the prior Application is considered part of and is incorporated by reference into this Patent Application.

BACKGROUND

A field-effect transistor (FET) is a type of transistor that uses an electric field to control the flow of current. A FET includes three terminals: a source, a gate, and a drain. In operation, a FET controls the flow of current through the application of a voltage to the gate which, in turn, alters conductivity between the drain and the source. A commonly used type of FET is a metal-oxide-semiconductor field-effect transistor (MOSFET). A MOSFET can be used, for example, as a switch for an electrical signal (e.g., a radio frequency (RF) switch) or as an amplifier for an electrical signal (e.g., a low-noise amplifier (LNA)), among other examples. A gate-all-around (GAA) structure may be formed as a type of MOSFET in which multiple alternating layers of gate material and silicon material are stacked between epitaxial structures. GAA structures may have improved device density in a width dimension (e.g., a critical dimension) when compared to a fin field-effect transistor (FinFET) structure. For example, GAA structures may be formed with sub-7 nanometer dimensions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagram of an example environment in which systems and/or methods described herein may be implemented.

DETAILED DESCRIPTION

Figure 2A:
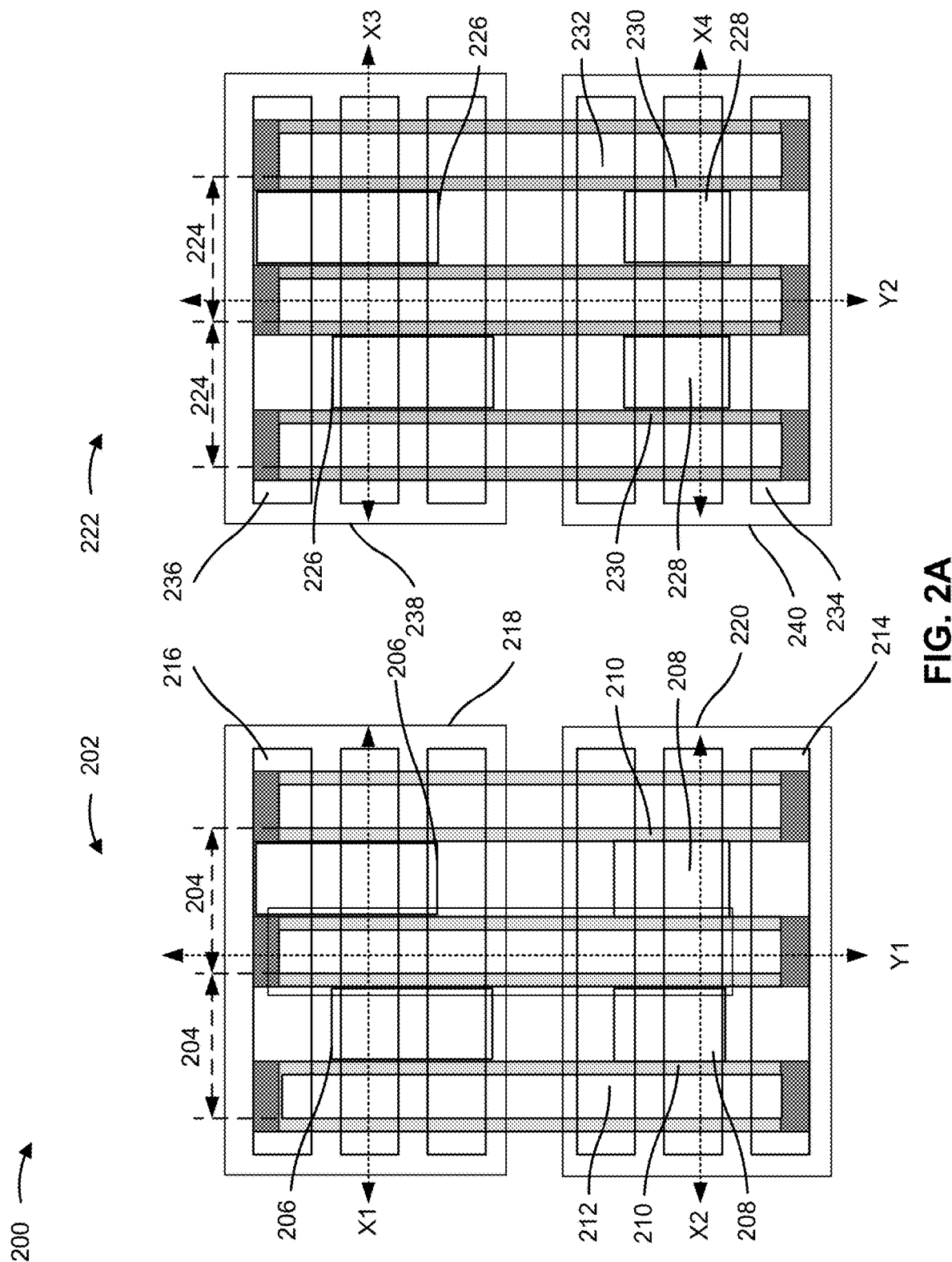
FIGS. 2A-2D are diagrams of an example semiconductor structure described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device may be formed having multiple field-effect transistors (FET) structures having different specifications that optimize different structures for different applications. For example, a first set of FET structures may be configured with a relatively high threshold voltage (Vt) and a second set of FET structures may be configured with a relatively low Vt. To form a fin field-effect transistor (FinFET) structure having devices with different Vts, one or more semiconductor processing tools may deposit a first set of materials for a first set of devices, selectively remove the first set of materials from one or more portions of the FinFET structure, and deposit a second set of materials to form a second set of devices (having a different Vt from the first set of devices) on the one or more portions of the FinFET structure.

Manufacturing processes present challenges for forming semiconductor devices that include GAAs structures having different Vts based on GAA structures being formed with sub-7 nanometer dimensions, and based on GAA structures being formed using multiple layers of gate material, channel material, and dielectric material stacked between epitaxial structures. For example, a manufacturing process may include depositing a first layer of a first set of GAA structures (e.g., configured for a first Vt) between a first set of epitaxial structures, attempting to remove the first layer from between a second set of epitaxial structures, and depositing a second layer of a second set of GAA structures (e.g., configured for a second Vt) between a second set of epitaxial structures. However, one or more semiconductor processing tools may fail to remove all of the first layer and/or may remove a portion of an additional layer below the first layer between the second set of epitaxial structures. The layer below the first layer may include a thin dielectric material, removal of which may cause the GAA structure to fail. Additionally, or alternatively, a processing time may increase based on increasing an amount of time for a removal operation used to attempt to remove the first layer and to remove subsequent layers of stacked materials to form the first set of GAA structures and the second set of GAA structures.

In some implementations described herein, dimensions (e.g., a gate pitch, a spacer width, a source/drain width, and/or a gate width, among other examples) of a first set of GAA structures may differ from dimensions of a second set of gate structures to configure the first set of GAA structures with a first Vt that is different from a second Vt of the second set of GAA structures. The dimensions may include a width (e.g., along one or more logical axes) of one or more layers of the first set of GAA structures and the second set of GAA structures. For example, a first width of a first set of layers of the first set of GAA structures may be different from a second width of a second set of layers of the second set of GAA structures. In some implementations, the first set of layers may have a same thickness as the second set of layers and/or may be formed in a same deposition process as the second set of layers. In this way, a semiconductor device may be formed with a first set of GAA structures configured with a first Vt and a second set of GAA structures configured with a second Vt without a need to deposit and remove layers of the GAA structures separately for the first set of GAA structures and the second set of GAA structures. This may allow the first set of GAA structures to be optimized for a first application and the second set of GAA structures to be optimized for a second application.

In some implementations, a first set of GAA structures is formed with a first gate pitch (e.g., spacing between gates along a width of a semiconductor structure and/or a sum of a gate width, spacer widths, and/or dielectric structure widths) and a second set of GAA structures is formed with a second gate pitch that is greater than the first gate pitch. The first set of GAA structures may be formed with a first set of source/drains having widths that are less than widths of a second set of source/drains of the second set of GAA structures. The second set of source/drains may be formed with a doping concentration that is greater than a doping concentration of the first set of source/drains. In this way, the first set of GAA structures may be configured for high density and low leakage applications and the second set of GAA structures may be configured for low resistance and/or low power consumption applications.

In some implementations, a first set of GAA structures is formed with a first gate width (e.g., along a width of a semiconductor structure) and a second set of GAA structures is formed with a second gate width that is less than the first gate width. The first set of GAA structures may be formed with a first set of source/drains having widths that are less than widths of a second set of source/drains of the second set of GAA structures. The second set of source/drains may be formed with a doping concentration that is greater than a doping concentration of the first set of source/drains. The first set of GAA structures and the second set of GAA structures may have a same gate pitch. In this way, the first set of GAA structures may be configured for low leakage and higher Vt applications and the second set of GAA structures may be configured for low resistance, lower Vt, and/or low power consumption applications. In some aspects, the first set of GAA structures has a Vt that is greater than the Vt of the second set of GAA structures by an amount in a range of approximately 10 millivolts to approximately 50 millivolts.

In some implementations, a first set of GAA structures is formed with a first gate pitch (e.g., spacing between gates along a width of a semiconductor structure) and a second set of GAA structures is formed with a second gate pitch that is greater than the first gate pitch. The first set of GAA structures may be formed with a first set of top spacers having widths that are less than widths of a second set of top spacers of the second set of GAA structures. In this way, the first set of GAA structures may be configured for high density applications and the second set of GAA structures may be configured for gate to contact capacitance reduction.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool 106, an ion implantation tool 108, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of a the substrate using a sputtering technique, a plasma-assisted etch technique (e.g., a plasma sputtering technique or another type of technique involving the use of an ionized gas to isotropically or directionally etch the one or more portions), or another type of dry etching technique.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The ion implantation tool 108 is a semiconductor processing tool that is capable of implanting ions into a substrate such as a semiconductor wafer. The ion implantation tool 108 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-106 and/or to and from other locations such as a wafer rack, a storage room, or another location. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

FIGS. 2A-2D are diagrams of an example semiconductor device 200 described herein. The semiconductor device 200 may include one or more additional devices, structures, and/or layers not shown in FIGS. 2A-2D. For example, the semiconductor device 200 may include additional layers formed on layers above and/or below the portion of the semiconductor device 200 shown in FIGS. 2A-2D. Additionally, or alternatively, one or more additional semiconductor structures may be formed in a same layer, with a lateral displacement, as the portion of the semiconductor device 200 shown in FIGS. 2A-2D.

Figure 2B:
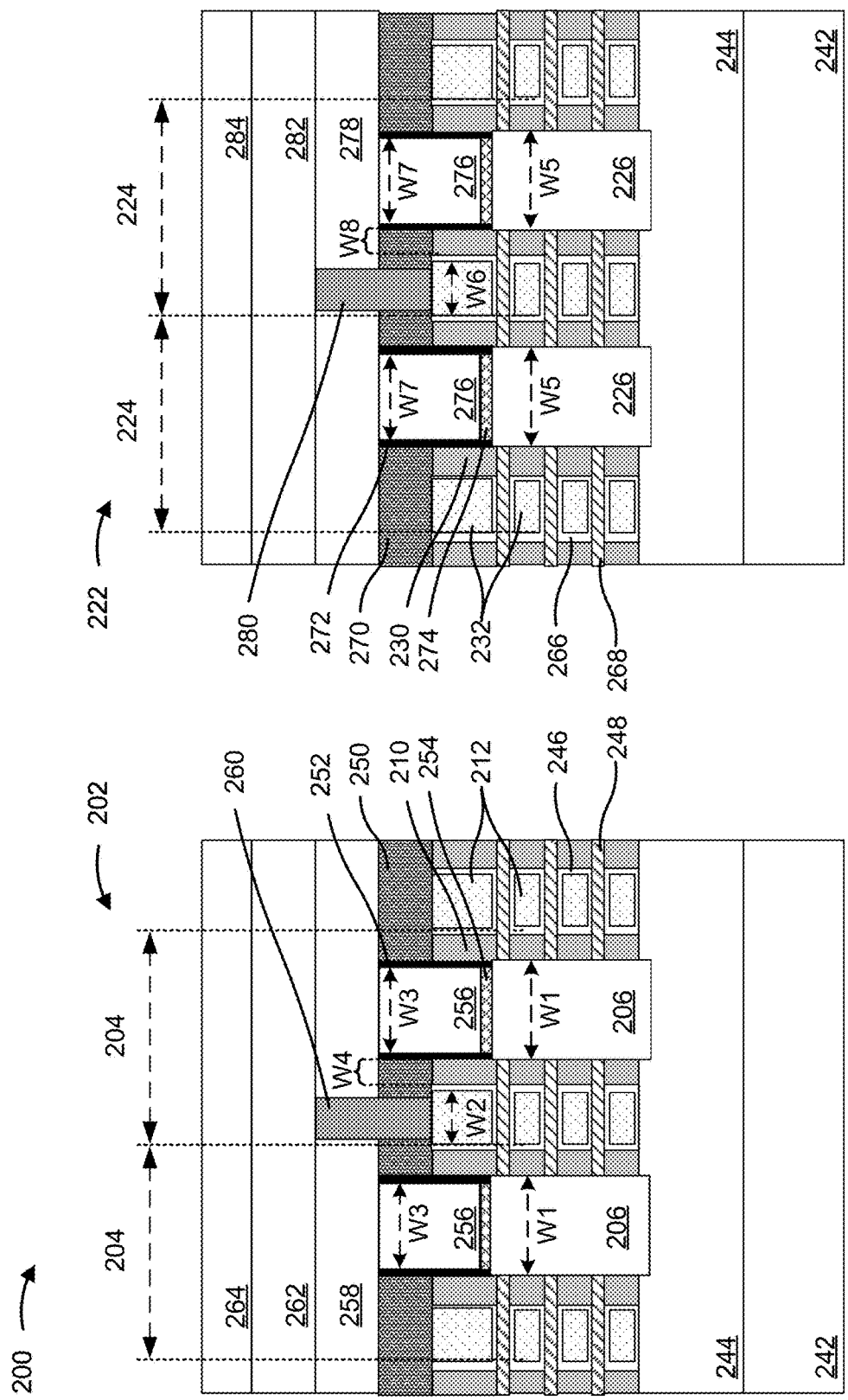
Figure 2C:
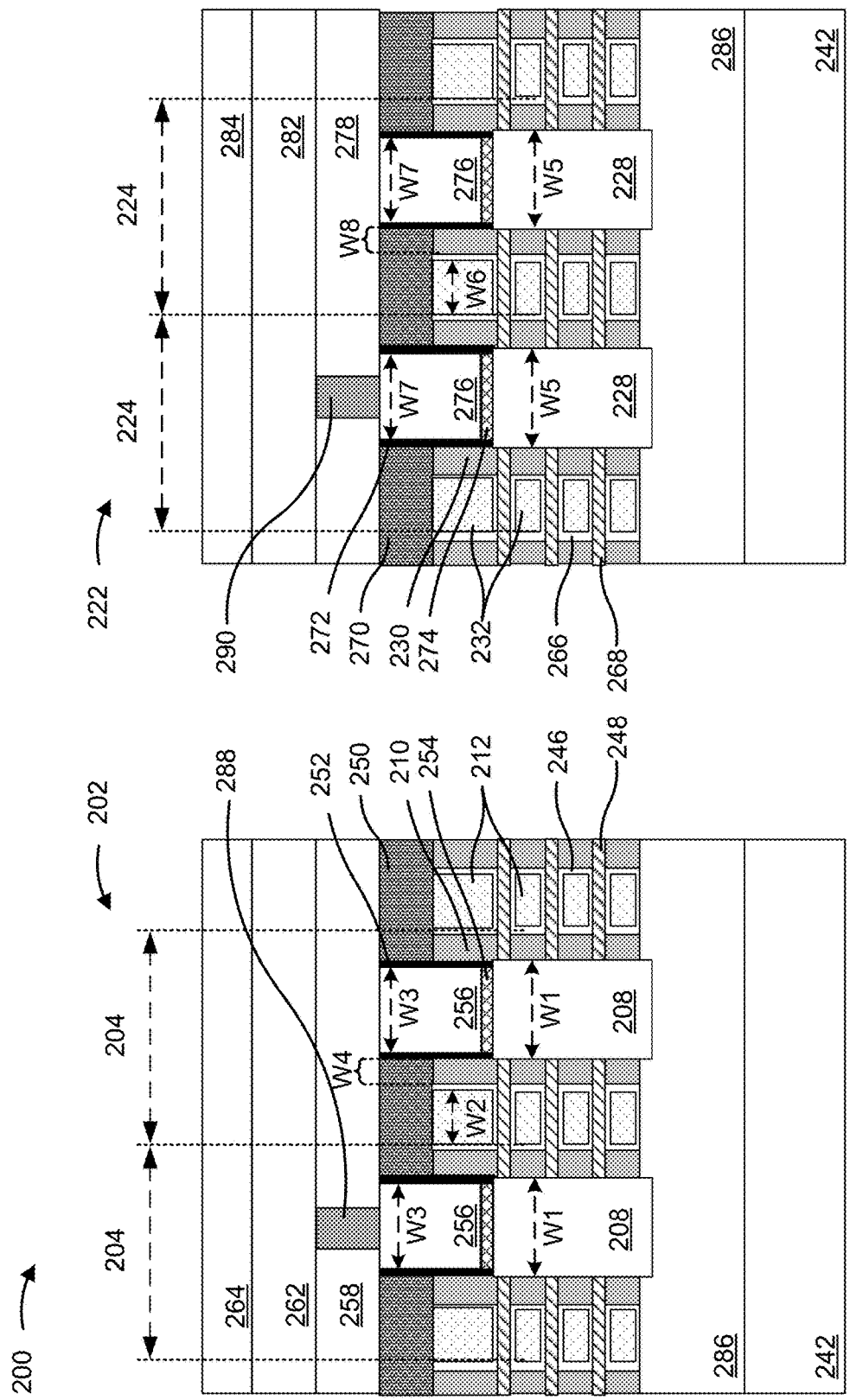
Figure 2D:
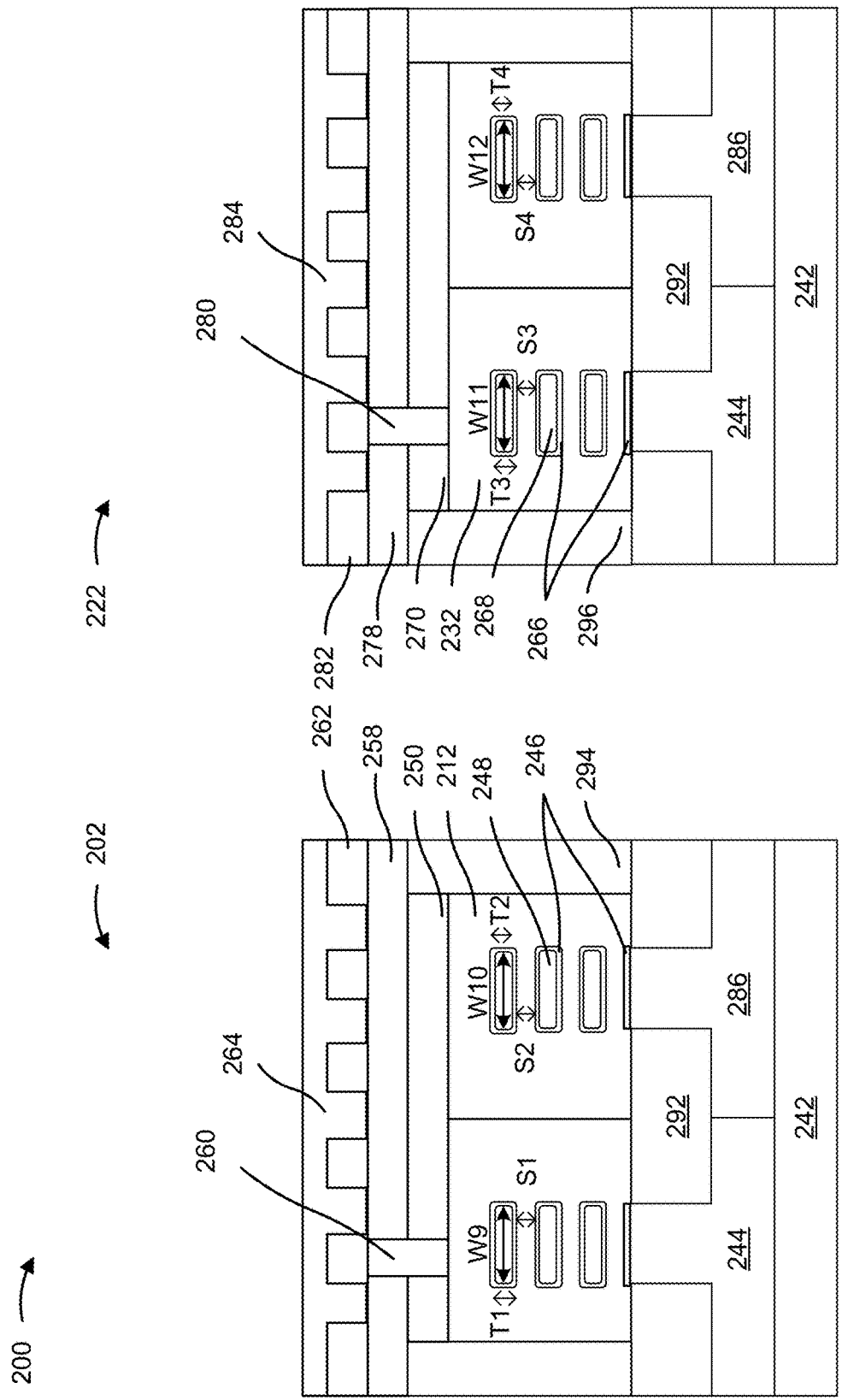

FIG. 2A shows a top view of the semiconductor device 200, FIG. 2B shows a cross-section of the semiconductor device 200 at locations indicated by X1 and X3 in FIG. 2A, FIG. 2C shows a cross-section of the semiconductor device 200 at locations indicated by X2 and X4 in FIG. 2A, and FIG. 2D shows a cross-section of the semiconductor device 200 at locations indicated by Y1 and Y2 in FIG. 2A.

As shown in FIG. 2A, a set of GAA structures 202 have a gate pitch 204 (e.g., a lateral distance between gates of the set of GAA structures 202). The set of GAA structures 202 includes source/drains 206 and 208. Source/drains 206 may be N-doped source/drains (e.g., with phosphorus doping) and source/drains 208 may be P-doped source/drains (e.g., with boron doping), or source/drains 206 may be P-type source/drains and source/drains 208 may be N-type source/drains. The source/drains 206 and 208 may include silicon-based material and/or silicon germanium-based material. For example, N-doped source/drains may include silicon and phosphorus (SiP), silicon and carbon (SiC), silicon phosphorus and carbon (SiPC), and/or silicon boron and arsenic (SiPAs), among other examples. P-doped source/drains may include silicon and germanium with boron doping (SiGe+B), silicon germanium and carbon with boron doping (SiGeC+B), germanium with boron doping (Ge+B), and/or silicon with boron doping (Si+B), among other examples. The source/drains 206 and/or 208 may be epitaxial structures.

The set of GAA structures 202 includes top spacers 210 disposed between gates 212 and the source/drains 206 and 208. The top spacers 210 may be formed of a dielectric material that provides electrical insulation between the gates 212 and the source/drains 206 and 208. The top spacers 210 may be formed adjacent to a top-most gate 212. Additional spacers (e.g., inner spacers, may be disposed below the top spacers 210 and adjacent to lower gates 212. The inner spacers may have a higher K value than the one or more top spacers. The inner spacers may include SiO2, Si3N4, SiON, SiOC, SiOCN, and/or an air gap, among other examples. The inner spacers may have a width that is different from (e.g., less than) a width of the top spacers 210. The one or more top spacers 210 may include SiO2, Si3N4, carbon-doped oxide, nitrogen-doped oxide, porous oxide, and/or an air gap, among other examples. The set of GAA structures 202 may include gate end dielectrics at the ends of the gates 212 to electrically insulate the gates 212 from other structures of the semiconductor device 200. In some implementations, the set of GAA structures 202 includes a gate-top dielectric layer disposed on a top surface of the gates 212. The gate-top dielectric layer may have a thickness in a range of approximately 2 nanometers to approximately 60 nanometers. The gate-top dielectric layer may include SiOC, SiON, SiOCN, nitride base dielectric, metal oxide dielectric, Hf oxide (HfO2), Ta oxide (Ta2O5), Ti oxide (TiO2), Zr oxide (ZrO2), Al oxide (Al2O3), and/or Y oxide (Y2O3), among other examples.

The set of GAA structures 202 may include a conductive structure 214 (e.g., in an M1 layer) that provides an electrical connection to a voltage drain (Vdd) for the semiconductor device 200. The set of GAA structures 202 may also include a conductive structure 216 (e.g., in the M1 layer) that provides an electrical connection to a voltage source (Vss) for the semiconductor device 200.

The set of GAA structures 202 may include a set of N-type metal-oxide field-effect transistors 218 (NMOSFETs) and a set of P-type metal-oxide field-effect transistors 220 (PMOSFETs). Active areas of the NMOSFETs (e.g., where writing, erasing, and reading functions are performed) may include a region of the set of GAA structures that includes the X1 cross-section and a region of the set of GAA structures that includes the X2 cross-section.

A set of GAA structures 222 have a gate pitch 224 (e.g., a distance between gates of the set of GAA structures 222). In some implementations, the gate pitch 224 has a same pitch as the gate pitch 204. In some implementations, the gate pitch 224 has a different pitch from the gate pitch 204. The set of GAA structures 222 includes source/drains 226 and 228. Source/drains 226 may be N-doped source/drains (e.g., with boron doping) and source/drains 228 may be P-doped source/drains (e.g., with phosphorus doping), or source/drains 226 may be P-type source/drains and source/drains 228 may be N-type source/drains. The source/drains 226 and 228 may include silicon-based material and/or silicon germanium-based material. For example, N-doped source/drains may include silicon and phosphorus (SiP), silicon and carbon (SiC), silicon phosphorus and carbon (SiPC), and/or silicon boron and arsenic (SiPAs), among other examples. P-doped source/drains may include silicon and germanium with boron doping (SiGe+B), silicon germanium and carbon with boron doping (SiGeC+B), germanium with boron doping (Ge+B), and/or silicon with boron doping (Si+B), among other examples. The source/drains 226 and/or 228 may be epitaxial structures.

In some implementations, the source/drains 226 and 228 may be formed in a same set of processes used to form the source/drains 206 and 208. For example, a first set of deposition and etching processes may be used to form the source/drains 206 and 226 and a second set of deposition and etching processes may be used to form the source/drains 208 and 228.

The set of GAA structures 222 includes top spacers 230 disposed between gates 232 and the source/drains 226 and 228. The top spacers 230 may be formed of a dielectric material that provides electrical insulation between the gates 232 and the source/drains 226 and 228. In some implementations, the top spacers 230 may be formed in a same set of processes used to form the top spacers 210. The top spacers 230 may be adjacent to a top-most gate 232. Additional spacers (e.g., inner spacers) may be disposed below the top spacers 230 and adjacent to lower gates 232. The one or more inner spacers may have a higher K value than the one or more top spacers 230. The one or more inner spacers may include $SiO_2$, $Si_3N_4$, SiON, SiOC, SiOCN, and/or an air gap, among other examples. The inner spacers may have a width that is different from (e.g., less than) a width of the top spacers 230. The one or more top spacers 230 may include $SiO_2$, $Si_3N_4$, carbon-doped oxide, nitrogen-doped oxide, porous oxide, and/or an air gap, among other examples. In some implementations, the gate end dielectrics at the ends of the gates 232 may be formed in a same set of processes used to form the gate end dielectrics at the ends of the gates 212. In some implementations, the set of GAA structures 222 includes a gate-top dielectric layer disposed on a top surface of the gates 232. The gate-top dielectric layer may have a thickness in a range of approximately 2 nanometers to approximately 60 nanometers. The gate-top dielectric layer may include SiOC, SiON, SiOCN, nitride base dielectric, metal oxide dielectric, Hf oxide (HfO2), Ta oxide (Ta2O5), Ti oxide (TiO2), Zr oxide (ZrO2), Al oxide (Al2O3), and/or Y oxide (Y2O3), among other examples.

The set of GAA structures 222 may include a conductive structure 234 (e.g., in the M1 layer) that provides an electrical connection to a voltage drain (Vdd) for the semiconductor device 200. The set of GAA structures 222 may also include a conductive structure 236 (e.g., in the M1 layer) that provides an electrical connection to a voltage source (Vss) for the semiconductor device 200.

The set of GAA structures 222 may include a set of NMOSFETs 238 and a set of PMOSFETS 240. Active areas of the NMOSFETs (e.g., where writing, erasing, and reading functions are performed) may include a region of the set of GAA structures that includes the X3 cross-section and a region of the set of GAA structures that includes the X4 cross-section.

FIG. 2B shows the gate pitch 204, the source/drains 206, the top spacers 210, and the gates 212 of FIG. 2A. Additionally, the semiconductor device 200 includes a substrate 242 and a P_Well 244 (disposed on the substrate 242) on which the source/drains 206, the top spacers 210, and the gates 212 are disposed. In some implementations, the source/drains 206 may extend into the P_Well 244 to a depth that is greater than a depth of the gates 212, the top spacers 210, and/or dielectric structures associated with the gates 212. For example, the source/drains 206 may extend into the P_Well 244 to a depth that is greater than the depth of the gates 212, the top spacers 210, and/or the dielectric structures by an amount within a range of approximately 3 nanometers to approximately 40 nanometers. The source/drains 206 may extend into the P_Well 244 based on migration of source/drain material of the source/drains 206 into the P_Well 244.

The semiconductor device 200 also includes a set of gate dielectric structures 246 that surround and encapsulate the gates 212. The set of gate dielectric structures 246 may provide electrical insulation between the gates 212 and the top spacers 210. In some implementations, the gate dielectric structures 246 may include an interfacial layer (e.g., a tunneling-oxide material) that is disposed between the gates 212 and channels 248 (e.g., silicon-based channels) that extend from the gates 212 to the source/drains 206. In some implementations, the gate dielectric structures 246 include oxide with nitrogen that is a doped dielectric (a first layer of the gate dielectric structures 246) and a high-k dielectric (e.g., with K≥13) that includes dielectric material with metal content. The high-k dielectric may include Ta2O5, Al2O3, Hf content oxide, Ta content oxide, Ti content oxide, Zr content oxide, Al content oxide, La content oxide, and/or a high-k dielectric material (K≥9). The gate dielectric structures 246 may have a thickness in a range of approximately 0.5 nanometers to approximately 3 nanometers. The channels 248 may extend from a first source/drain 206 to a second source/drain 206 between the gates 212 and the top spacers 210.

On a top surface of a top layer gate 212, the semiconductor device 200 may include a dielectric layer 250. The dielectric layer 250 provides electrical insulation between the gates 212 and upper layers of the semiconductor device 200.

The semiconductor device 200 may include a conductive structure that provides an electrical connection to a top surface of the source/drains 206. The conductive structure may include a sidewall liner 252 (e.g., a silicon germanium-based material, or another type of contact etch stop layer) and/or a bottom liner 254 (e.g., a silicide-based material). The conductive structure may further include a contact 256 that includes a conductive material, such as titanium, titanium nitride, platinum, tungsten, cobalt, ruthenium, iridium, rhodium, tantalum nitride, and/or copper, among other examples.

The semiconductor device 200 may include an inter-layer dielectric 258 disposed on a top surface of the dielectric layer 250, the contact 256, and/or the sidewall liner 252. The inter-layer dielectric 258 may include a low-k material, such as silicon dioxide, silicon nitride, or silicon oxynitride, among other examples. The inter-layer dielectric 258 may provide structural support to the semiconductor device 200 and electrical insulation between structures within the semiconductor device 200.

The semiconductor device 200 may include a conductive structure 260 (e.g., a gate via) that extends through the inter-layer dielectric 258 and the dielectric layer 250 to a top surface of the top layer gate 212. The conductive structure 260 may include an interconnect and/or a plug that includes, for example, titanium, titanium nitride, platinum, tungsten, cobalt, ruthenium, iridium, rhodium, tantalum nitride, and/or copper, among other examples. The conductive structure 260 provides an electrical connection between the gates 212 and a conductive structure 262 in a layer (e.g., an M1 layer) of the semiconductor device 200. The conductive structure 262 may include a metal material such as copper (e.g., a copper bit line), cobalt, or tungsten, among other examples. The semiconductor device 200 may include an inter-metal dielectric 264 disposed on a top surface, and between elements (e.g., and on a top surface of the inter-layer dielectric 258), of the conductive structure 262.

FIG. 2B also shows the gate pitch 224, the source/drains 226, the top spacers 230, and the gates 232 of FIG. 2A. The semiconductor device 200 also includes a P_Well 244 disposed on the substrate 242 on which the source/drains 226, the top spacers 230, and the gates 232 are disposed. In some implementations, the P_Well 244 includes a same material as the P_Well 244. The P_Well 244 and the P_Well 244 may be disposed in a same deposition process and/or may have a same thickness. In some implementations, the source/drains 226 may extend into the P_Well 244 to a depth that is greater than a depth of the gates 232, the top spacers 230, and/or dielectric structures associated with the gates 232. For example, the source/drains 226 may extend into the P_Well 244 to a depth that is greater than the depth of the gates 232, the top spacers 230, and/or the dielectric structures by an amount within a range of approximately 3 nanometers to approximately 40 nanometers. The source/drains 226 may extend into the P_Well 244 based on migration of source/drain material of the source/drains 226 into the P_Well 244.

The semiconductor device 200 also includes a set of gate dielectric structures 266 that surround and encapsulate the gates 232. The set of gate dielectric structures 266 may provide electrical insulation between the gates 232 and the top spacers 230. In some implementations, the gate dielectric structures 266 may include an interfacial layer (e.g., a tunneling-oxide material) that is disposed between the gates 232 and channels 268 (e.g., silicon-based channels) that extend from the gates 232 to the source/drains 226. In some implementations, the gate dielectric structures 266 include oxide with nitrogen that is a doped dielectric (a first layer of the gate dielectric structures 266) and a high-k dielectric (e.g., with K≥13) that includes dielectric material with metal content. The high-k dielectric may include Ta2O5, Al2O3, Hf content oxide, Ta content oxide, Ti content oxide, Zr content oxide, Al content oxide, La content oxide, and/or a high-k dielectric material (K≥9). The gate dielectric structures 266 may have a thickness in a range of approximately 0.5 nanometers to approximately 3 nanometers. The channels 268 may extend from a first source/drain 226 to a second source/drain 226 between the gates 232 and the top spacers 230.

On a top surface of a top layer gate 232, the semiconductor device 200 may include a dielectric layer 270. The dielectric layer 270 provides electrical insulation between the gates 232 and upper layers of the semiconductor device 200.

The semiconductor device 200 may include a conductive structure that provides an electrical connection to a top surface of the source/drains 226. The conductive structure may include a sidewall liner 272 (e.g., a silicon germanium-based material, or another type of contact etch stop layer) and/or a bottom liner 274 (e.g., a silicide-based material). The conductive structure may further include a contact 256 that includes a conductive material, such as titanium, titanium nitride, platinum, tungsten, cobalt, ruthenium, iridium, rhodium, tantalum nitride, and/or copper, among other examples The semiconductor device 200 may include an inter-layer dielectric 278 disposed on a top surface of the dielectric layer 270, the contact 276, and/or the sidewall liner 272. The inter-layer dielectric 278 may include a low-k material, such as silicon dioxide, silicon nitride, or silicon oxynitride, among other examples. The inter-layer dielectric 278 may provide structural support to the semiconductor device 200 and electrical insulation between structures within the semiconductor device 200.

The semiconductor device 200 may include a conductive structure 280 (e.g., a gate via) that extends through the inter-layer dielectric 278 and the dielectric layer 270 to a top surface of the top layer gate 232. The conductive structure 280 may include an interconnect and/or a plug that includes, for example, titanium, titanium nitride, platinum, tungsten, cobalt, ruthenium, iridium, rhodium, tantalum nitride, and/or copper, among other examples. The conductive structure 280 provides an electrical connection between the gates 232 and a conductive structure 282 in a layer (e.g., the M1 layer) of the semiconductor device 200. The conductive structure 282 may include a metal material such as copper (e.g., a copper bit line), cobalt, or tungsten, among other examples. The semiconductor device 200 may include an inter-metal dielectric 284 disposed on a top surface, and between elements (e.g., and on a top surface of the inter-layer dielectric 278), of the conductive structure 282.

As shown in FIG. 2B, the source/drains 206 have a width W1, the gates 212 have a width W2, the contact 256 has a width W3, and the top spacers 210 have a width W4. In some implementations, W1 is greater than W3 based on the contact 256 and the sidewall liner 252 having a combined width that is approximately equal to W1. W3 may be greater than W2 and W2 may be greater than W4. In some implementations, W4 may be in a range of approximately 3 nanometers to approximately 12 nanometers.

As further shown in FIG. 2B, the source/drains 226 have a width W5, the gates 232 have a width W6, the contact 276 has a width W7, and the top spacers 210 have a width W8. In some implementations, W5 is greater than W7 based on the contact 276 and the sidewall liner 272 having a combined width that is approximately equal to W5. W7 may be greater than W6 and W6 may be greater than W8. In some implementations, W8 may be in a range of approximately 3 nanometers to approximately 12 nanometers.

The width W1 relative to the width W5, the width W2 relative to the width W6, the width W3 relative to the width W7, and/or the width W4 relative to the width W8 may be configured to optimize the set of GAA structures 202 and the set of GAA structures 222 for different applications. These relative widths for optimizations are discussed in greater detail in connection with FIGS. 4A-4C.

FIG. 2C shows structures also shown in FIGS. 2A and 2B. In the X2 and X4 cross-sections shown in FIG. 2C, the semiconductor device 200 includes an N_Well 286 (e.g., with boron doping) disposed on the substrate 242 instead of the P_Well 244 shown in the X1 and X3 cross-sections of FIG. 2B. Additionally, the X2 and X4 cross-sections show an N_Well 286 (e.g., with boron doping) instead of the P_Well 244 shown in the X1 and X3 cross-sections of FIG. 2B. In some implementations, the N_Well 286 includes a same material as the N_Well 286. The N_Well 286 and the N_Well 286 may be disposed in a same deposition process and/or may have a same thickness.

In some implementations, the source/drains 208 may extend into the N_Well 286 to a depth that is greater than a depth of the gates 212, the top spacers 210, and/or the gate dielectric structures 246 associated with the gates 212. For example, the source/drains 206 may extend into the N_Well 286 to a depth that is greater than the depth of the gates 212, the top spacers 210, and/or the gate dielectric structures 246 by an amount within a range of approximately 3 nanometers to approximately 40 nanometers.

In some implementations, the source/drains 228 may extend into the N_Well 286 to a depth that is greater than a depth of the gates 232, the top spacers 230, and/or the gate dielectric structures 266 associated with the gates 232. For example, the source/drains 228 may extend into the N_Well 286 to a depth that is greater than the depth of the gates 232, the top spacers 230, and/or the gate dielectric structures 266 by an amount within a range of approximately 3 nanometers to approximately 40 nanometers.

As further shown in FIG. 2C, the set of GAA structures 202 includes a conductive structure 288 (e.g., a source/drain via) that provides an electrical connection between the contact 256 and the conductive structure 262 through the inter-layer dielectric 258. The conductive structure 288 may include titanium, titanium nitride, platinum, tungsten, cobalt, ruthenium, iridium, rhodium, tantalum nitride, and/or copper, among other examples. Similarly, the set of GAA structures 222 includes a conductive structure 290 (e.g., a source/drain via) that provides an electrical connection between the contact 276 and the conductive structure 282 through the inter-layer dielectric 278. The conductive structure 290 may include titanium, titanium nitride, platinum, tungsten, cobalt, ruthenium, iridium, rhodium, tantalum nitride, and/or copper, among other examples.

FIG. 2D shows structures also shown in FIGS. 2A-2C. In the Y1 cross-section shown in FIG. 2D, the P_Well 244 and the N_Well 286 include portions that extend upward between trench isolation structures 292 (e.g., shallow trench isolation structures). In some implementations, the trench isolation structures 292 have a thickness in a range of approximately 30 nanometers to approximately 80 nanometers. A dielectric structure 246 of the gate dielectric structures 246 may be disposed on a top surface of the portion of the P_Well 244 that extends upward and another dielectric structure 246 of the gate dielectric structures 246 may be disposed on a top surface of the portion of the N_Well 286 that extends upward. The gate dielectric structures 246 provide electrical insulation for the P_Well 244 and the N_Well 286, for example, as a gate dielectric.

A volume of first work function metal (e.g., a first NMOSFET-work-function metal), that forms the gates 212 shown in FIGS. 2B and 2C, is disposed on a dielectric structure 246 above the P_Well 244 and on the trench isolation structures 292. A first set of the channels 248 are disposed within the first work function metal and above the portion of the P_Well 244 that extends upward. The first set of the channels 248 are electrically insulated from the first work function metal by the gate dielectric structures 246 (e.g., gate dielectrics and/or gate oxides, among other examples). In some implementations, the gate dielectric structures 246 may fully or partially surround portions of the first set of the channels 248 that are within a portion of the set of GAA structures 202 having the first work function metal. For example, the first set of the channels 248 extend between the source/drains 206, and the gate dielectric structures 246 may be disposed between the first set of the channels 248 and the first work function metal, but may not be disposed between the first set of the channels 248 and the source/drains 206.

A volume of second work function metal (e.g., a first NMOSFET-work-function metal), that forms the gates 212 shown in FIGS. 2B and 2C, is disposed on a dielectric structure 246 above the N_Well 286 and on the trench isolation structures 292. A second set of the channels 248 are disposed within the second work function metal and above the portion of the N_Well 286 that extends upward. The second set of the channels 248 are electrically insulated from the second work function metal by the gate dielectric structures 246. In some implementations, the gate dielectric structures 246 may fully or partially surround portions of the second set of the channels 248 that are within a portion of the set of GAA structures 202 having the second work function metal. For example, the second set of the channels 248 extend between the source/drains 206, and the gate dielectric structures 246 may be disposed between the second set of the channels 248 and the second work function metal, but may not be disposed between the second set of the channels 248 and the source/drains 206.

In some implementations, the first work function metal and the second work function metal may be electrically insulated from other structures of the semiconductor device 200 by one or more gate end dielectrics 294.

In the Y2 cross-section shown in FIG. 2D, the P_Well 244 and the N_Well 286 include portions that extend upward between the trench isolation structures 292. A dielectric structure 266 of the gate dielectric structures 266 may be disposed on a top surface of the portion of the P_Well 244 that extends upward and another dielectric structure 266 of the gate dielectric structures 266 may be disposed on a top surface of the portion of the N_Well 286 that extends upward. The gate dielectric structures 266 provide electrical insulation for the P_Well 244 and the N_Well 286, for example, as a gate dielectric.

A volume of the first work function metal (e.g., the same first work function metal used in the set of GAA structures 202), that forms the gates 232 shown in FIGS. 2B and 2C, is disposed on a dielectric structure 266 above the P_Well 244 and on the trench isolation structures 292. A first set of the channels 268 are disposed within the first work function metal and above the portion of the P_Well 244 that extends upward. The first set of the channels 268 are electrically insulated from the first work function metal by the gate dielectric structures 266 (e.g., gate dielectrics and/or gate oxides, among other examples). In some implementations, the gate dielectric structures 266 may fully or partially surround portions of the first set of the channels 268 that are within a portion of the set of GAA structures 222 having the first work function metal. For example, the first set of the channels 268 extend between the source/drains 226, and the gate dielectric structures 266 may be disposed between the first set of the channels 268 and the first work function metal, but may not be disposed between the first set of the channels 268 and the source/drains 226.

A volume of second work function metal (e.g., a first NMOSFET-work-function metal), that forms the gates 232 shown in FIGS. 2B and 2C, is disposed on a dielectric structure 266 above the N_Well 286 and on the trench isolation structures 292. A second set of the channels 268 are disposed within the second work function metal and above the portion of the N_Well 286 that extends upward. The second set of the channels 268 are electrically insulated from the second work function metal by the gate dielectric structures 266. In some implementations, the gate dielectric structures 266 may fully or partially surround portions of the second set of the channels 268 that are within a portion of the set of GAA structures 222 having the second work function metal. For example, the second set of the channels 268 extend between the source/drains 226, and the gate dielectric structures 266 may be disposed between the second set of the channels 268 and the second work function metal, but may not be disposed between the second set of the channels 268 and the source/drains 226.

In some implementations, the first work function metal and the second work function metal may be electrically insulated from other structures of the semiconductor device 200 by one or more gate end dielectrics 296.

As shown in FIG. 2D, the first set of the channels 248 have a thickness T1, a width W9, and a spacing (e.g., vertical spacing) of S1. The second set of the channels 248 have a thickness T2, a width W10, and a spacing (e.g., vertical spacing) of S2. The first set of the channels 268 have a thickness T3, a width W11, and a spacing (e.g., vertical spacing) of S3. The second set of the channels 268 have the thickness T4, a width W12, and a spacing (e.g., vertical spacing) S4. In some implementations, the thickness T1 is approximately equal (e.g., within approximately 5%) to the thickness T2, the thickness T3 is approximately equal (e.g., within approximately 5%) to the thickness T4, the spacing S1 is approximately equal (e.g., within approximately 5%) to the spacing S3, and/or the spacing S2 is approximately equal (e.g., within approximately 5%) to the spacing S4 based on, for example, using a same set of deposition and/or etching processes to form the channels 248 and the channels 268, the gates 212 and the gates 232, and/or the gate dielectric structures 246 and the gate dielectric structures 266.

In some implementations, the set of gate dielectric structures 246 may have a same thickness as the set of gate dielectric structures 266. In some implementations, the set of gate dielectric structures 246 may be deposited in a same process used to deposit the set of gate dielectric structures 266. In this way, a manufacturing process may reduce a number of depositions and removals of materials to separately form the set of gate dielectric structures 246 and the gate dielectric structures 266.

In some implementations, S1 is approximately equal to S2 (e.g., within 5%), S1 is approximately equal to S3 (e.g., based on being formed in a same deposition process), S2 is approximately equal to S4 (e.g., based on being formed in a same deposition process), and/or S3 is approximately equal to S4 (e.g., within 5%). In some implementations, the channels 248 and 268 have a pitch (e.g., T1+S1, T2+S2, T3+S3, and T4+S4) that is in a range of approximately 10 nanometers to approximately 23 nanometers. In some implementations, T1, T2, T3, and T4 are in a range of approximately 4 nanometers to approximately 8 nanometers. In some implementations, S1, S2, S3, and S4 are in a range of approximately 6 nanometers to approximately 15 nanometers In some implementations, a first work function metal used to form a first subset of the gates 212 (e.g., above the P_Well 244) may be a same work function metal used to form a first subset of the gates 232 (e.g., above the P_Well 244). In some implementations, a second work function metal (e.g., a different material from the first work function metal or a same material as the first work function metal) used to form a second subset of the gates 212 (e.g., above the N_Well 286) may be a same work function metal used to form a second subset of the gates 232 (e.g., above the N_Well 286). In this way, a manufacturing process may include using a combined deposition process (e.g., including one or more deposition steps) to deposit layers of the first subset of the gates 212 and the first subset of the gates 232 and may include using a combined deposition process to deposit layers of the second subset of the gates 212 and the second subset of the gates 232, which may reduce a number of depositions and removals of materials to separately form each of the four work function metals and the associated gates between the channels 248 and 268. This may reduce occurrences of etching away the set of gate dielectric structures 246 and 266, which may cause a short between the gates 212 and 232 and the channels 248 and 268, respectively.

In some implementations, the first set of channels 248 are deposited in a same process used to deposit the first set of the channels 268. In some implementations, the second set of channels 248 are deposited in a same process used to deposit the second set of the channels 268. In some implementations, T1 is approximately equal to T2 (e.g., within 5%), T1 is approximately equal to T3, and/or T2 is approximately equal to T4. A manufacturing process may include using a combined deposition process (e.g., including one or more deposition steps) to deposit the first set of channels 248 and the first set of the channels 268 and may include using a combined deposition process to deposit the second set of channels 248 and the second set of the channels 268, which may reduce a number of depositions and removals of materials to separately form each of the four sets of channels 248 and 268. This may reduce occurrences of etching away the set of gate dielectric structures 246 and 266, which may cause a short between the gates 212 and 232 and the channels 248 and 268, respectively.

As also shown in FIG. 2D, the conductive structure 262 may include multiple elements that are separated via the inter-metal dielectric 264. In some implementations, the conductive structure 260 is electrically coupled to one or more of the elements of the conductive structure 262. In some implementations, a first element of the conductive structure 262 provides electrical coupling to an input voltage (e.g., a source voltage (Vss)) and a second element of the conductive structure 262 provides electrical coupling to an output voltage (e.g., a drain voltage (Vdd)). Similarly, the conductive structure 282 may include multiple elements that are separated via the inter-metal dielectric 284. In some implementations, the conductive structure 280 is electrically coupled to one or more of the elements of the conductive structure 282. In some implementations, a first element of the conductive structure 282 provides electrical coupling to an input voltage (e.g., a source voltage (Vss)) and a second element of the conductive structure 282 provides electrical coupling to an output voltage (e.g., a drain voltage (Vdd)). In some implementations, the conductive structure 282 and the conductive structure 262 are a same structure and/or are disposed in a same metal layer of the semiconductor device 200.

In some implementations, dimensions of structures of the set of GAA structures 202 may be different from dimensions of structures of the set of GAA structures 222. The different dimensions may cause the set of GAA structures 202 to be optimized for different applications than the set of GAA structures 222. For example, the GAA structures 202 may be optimized with different Vts, different standby power, different speeds (e.g., for program, erase, and/or read operations), capacitance, and/or resistances.

As indicated above, FIGS. 2A-2D are provided as examples. Other examples may differ from what is described with regard to FIGS. 2A-2D.

FIGS. 3A-3I are diagrams of an example implementation 300 described herein. Example implementation 300 may be an example process for forming the semiconductor device 200 of FIGS. 2A-2D and/or semiconductor devices shown in FIGS. 4A-4C. FIGS. 3A-3I show the example implementations 300 from the X2 and X4 cross-sections (e.g., as shown in FIG. 2C). The semiconductor device 200 may include one or more additional devices, structures, and/or layers not shown in FIGS. 3A-3I.

Figure 3A:
FIGS. 3A-3I are diagrams of an example implementation described herein.

As shown in FIG. 3A, an N_Well 286 is disposed on a substrate 242. In some implementations, the N_Well 286 may include portions that extend upward between trench isolation structures. In some implementations, one or more semiconductor processing tools form the N_Well 286 on a top surface of the substrate 242 based on depositing a layer of well material and implanting ions into the well material (e.g., using the ion implantation tool 108). In some implementations, the one or more semiconductor processing tools (e.g., the etching tool 104) etches one or more portions of the well material to form one or more recesses in the well material. After forming the one or more recesses in the well material, the one or more semiconductor processing tools (e.g., the deposition tool 102) may deposit a trench isolation material into the one or more recesses in the well material. FIG. 3A shows portions of the N_Well 286 that are between trench isolation structures.

In some implementations, a semiconductor processing tool (e.g., the planarization tool 106) may polish and/or planarize the substrate 242 before depositing the N_Well 286 and/or may polish and/or planarize the N_Well 286 after depositing the well material to form a generally planar top surfaces of the substrate 242 and/or the N_Well 286. In this way, the top surface of the second substrate 242 and/or the N_Well 286 may be suitable for depositing additional material of the semiconductor device 200.

Figure 3B:
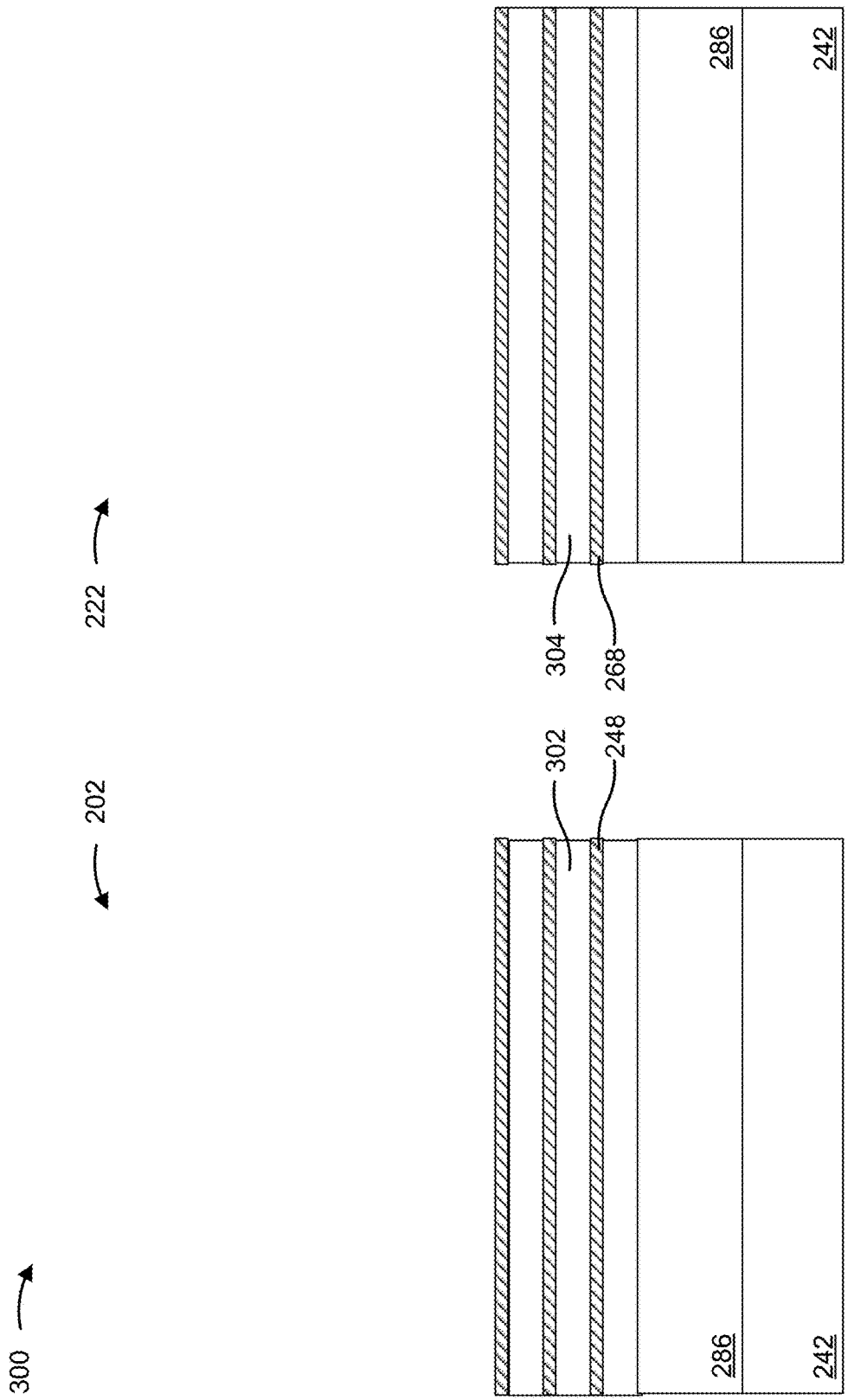

As shown in FIG. 3B, example implementation 300 may include depositing a first set of stacks of first silicon-base layers (to be formed into channels 248, also referenced as the first silicon-based layers 248) and second silicon-based layers 302 and 304. The second silicon-based layers 302 and 304 may be deposited on the N_Well 286 (or the P_Well in other implementations) and the first silicon-based layers may be deposited on the second silicon-based layers in an alternating pattern. In some implementations, the one or more semiconductor processing tools (e.g., deposition tool 102) alternatingly deposits material for the first silicon-based layers and material for the second silicon-based layers until a desired number of layers are formed. For example, the deposition tool 102 may alternatingly deposit the material for the first silicon-based layers the second silicon-based layers on the top surface of the N_Well 286 using chemical vapor deposition or physical vapor deposition, among other examples.

In some implementations, the first silicon-based layers include a germanium-free silicon material (e.g., having a concentration of silicon that is less than approximately 1%) and the second silicon-based layers include a germanium and silicon material (e.g., having a concentration of silicon that is greater than approximately 1%). Alternatively, the second silicon-based layers may include a germanium-free silicon material (e.g., having a concentration of silicon that is less than approximately 1%) and the first silicon-based layers may include a germanium and silicon material (e.g., having a concentration of silicon that is greater than approximately 1%).

The first silicon-based layers may have a first thickness in the set of GAA structures 202 and a second thickness in the set of GAA structures 222. The first thickness may be approximately equal to the second thickness. The second silicon-based layers may have a first thickness in the set of GAA structures 202 and a second thickness in the set of GAA structures 222. The first thickness may be approximately equal to the second thickness. In some implementations, the first thickness of the first silicon-based layers may be approximately equal to the first thickness of the second silicon-based layers and/or the second thickness of the first silicon-based layers may be approximately equal to the second thickness of the second silicon-based layers.

In some implementations, the first silicon-based layers for the set of GAA structures 202 are deposited in a same operation as deposition of the first silicon-based layers for the set of GAA structures 222. In some implementations, the second silicon-based layers for the set of GAA structures 202 are deposited in a same operation as deposition of the second silicon-based layers for the set of GAA structures 222.

In some implementations, the one or more semiconductor processing tools (e.g., planarization tool 106) polish and/or planarize top surfaces of the first silicon-based layers and/or the second silicon-based layers to form generally planar top surfaces. In this way, the top surfaces of the first silicon-based layers and/or the second silicon-based layers may be suitable for depositing additional material of the semiconductor device 200 and/or may improve uniformity of a subsequent etching process.

Figure 3C:
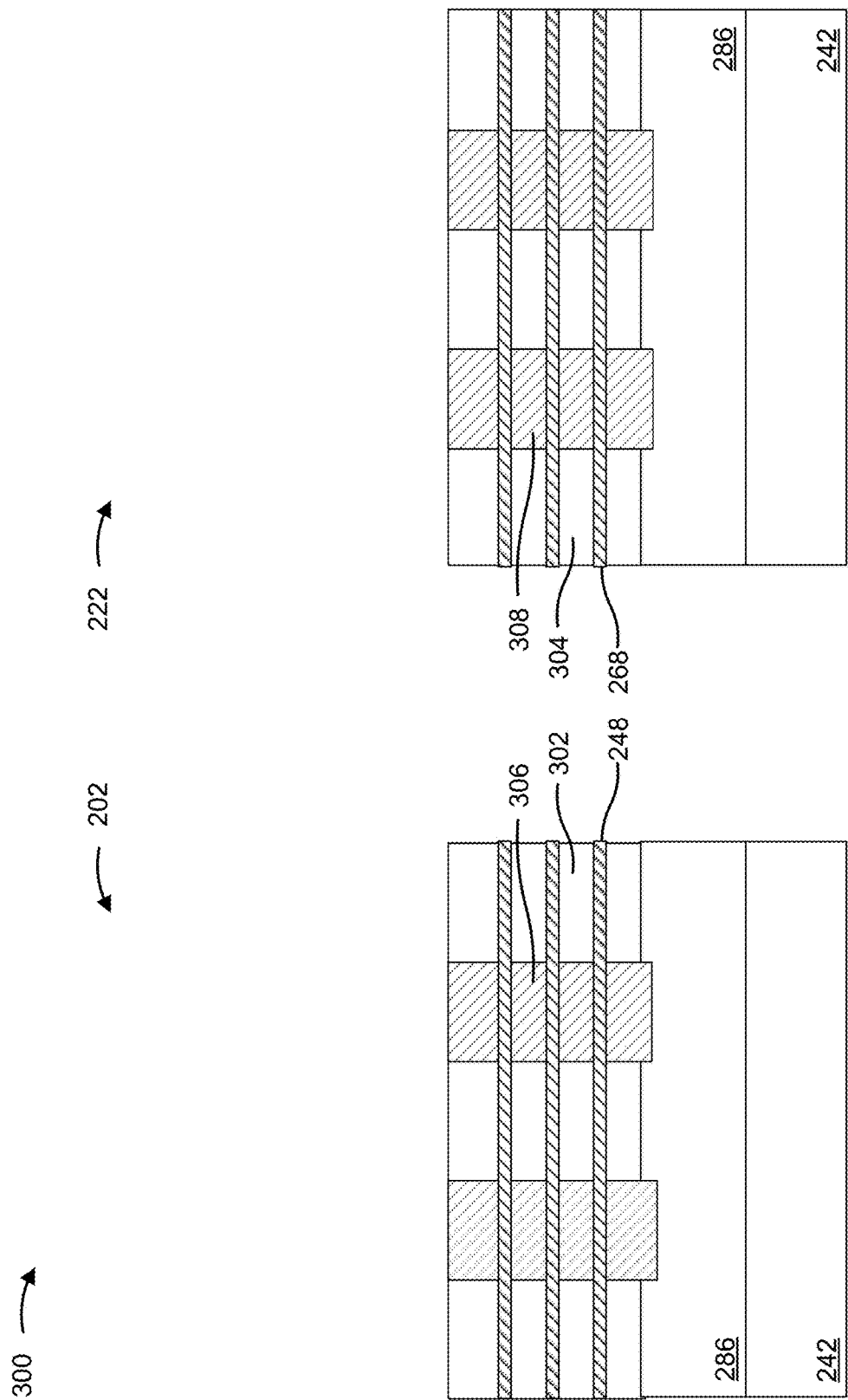

As shown in FIG. 3C, example implementation 300 may include removing portions of the second silicon-based layers 302 and 304 at a source/drain region 306 and at a source/drain region 308 of the semiconductor device 200. In some implementations, the one or more semiconductor processing tools (e.g., etching tool 104) etch the one or more portions of the second silicon-based layers 302 and 304. In some implementations, the one or more semiconductor processing tools performs wet etching using a chemical that is configured to selectively etch material of the second silicon-based layers 302 and 304 and to have reduced etching of the first silicon-based layers 248 relative to the second silicon-based layers 302 and 304. In some implementations, the one or more semiconductor processing tools may perform one or more operations to prevent or reduce etching outside of the source/drain portion of the semiconductor device 200. For example, a hard mask or a photoresist may be applied to a top surface of the top-most layer of the second silicon-based layers 302 and 304 at regions outside of the source/drain regions 306 and 308 before etching the portions of the second silicon-based layers 302 and 304 at the source/drain regions 306 and 308.

Figure 3D:
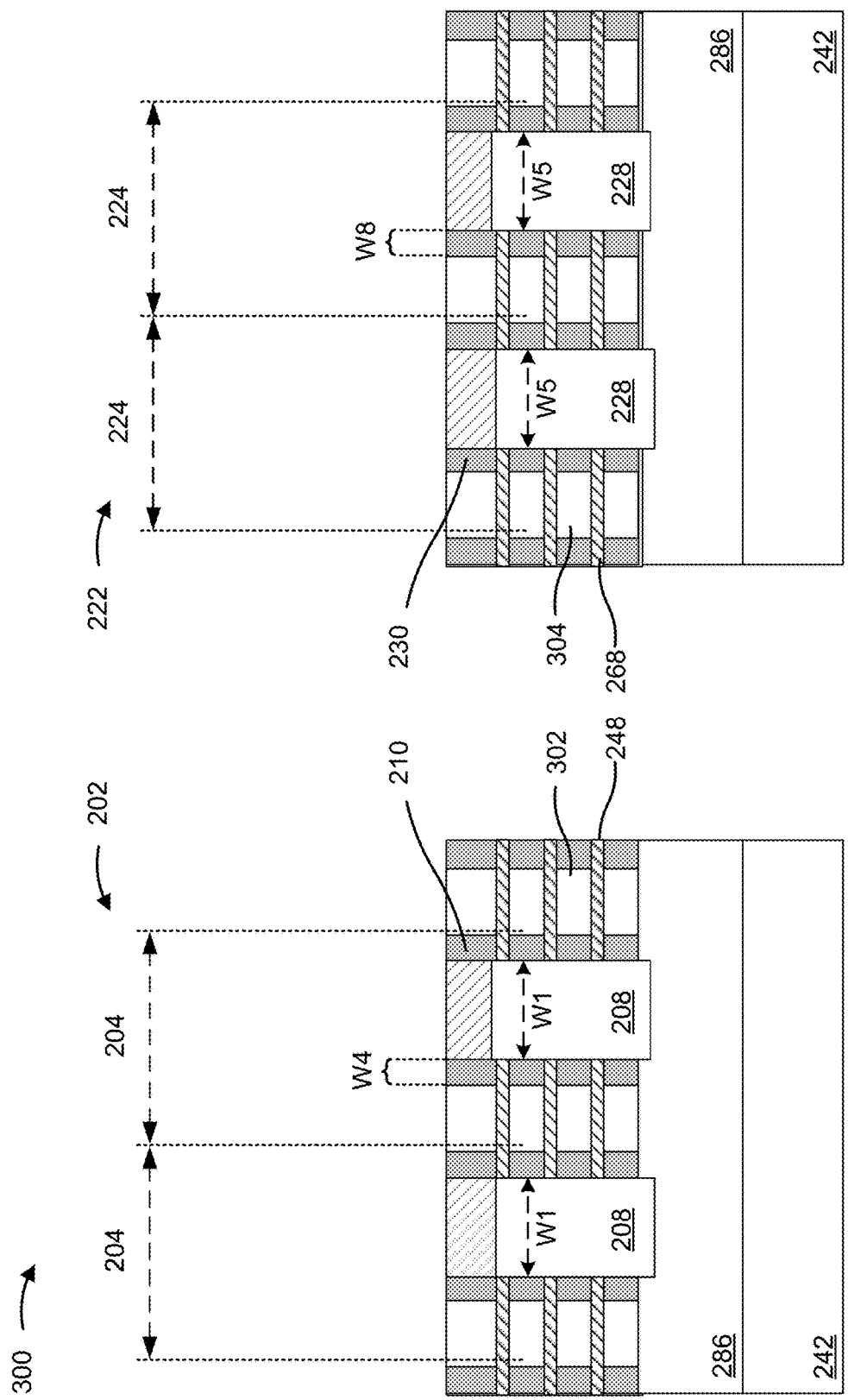

As shown in FIG. 3D, example implementation 300 may include forming a first set of source/drains 208 between stacks of the first set of stacks and forming a second set of source/drains 228 between stacks of the second set of stacks. Additionally, example implementation may include forming a first set of top spacers 210 between source/drains of the first set of source/drains 208 and stacks of the first set of stacks and forming a second set of top spacers 230 between source/drains of the second set of source/drains 228 and stacks of the second set of stacks. In some implementations, the one or more semiconductor processing tools (e.g., deposition tool 102) deposit (e.g., using a chemical vapor deposition or an atomic layer deposition, among other examples) the first set of top spacers 210 on sidewalls of the stacks of the first set of stacks and deposits the second set of top spacers 230 on sidewalls of the stacks of the second set of stacks. In some implementations, an etching tool removes a portion of material of the first set of top spacers 210 from the source/drain regions 306 after depositing the first set of top spacers 210 and removes a portion of material of the second set of top spacers 230 from the source/drain regions 308 after depositing the second set of top spacers 230. In some implementations, the one or more semiconductor processing tools deposits (e.g., using a chemical vapor deposition or an atomic layer deposition, among other examples) material of the source/drains 208 between elements of the first set of top spacers 210 (and inner spacers below the top spacers 210) and deposits material of the source/drains 228 between elements of the second set of top spacers 230 (and inner spacers below the top spacers 230) In some implementations, deposition of the source/drains 208 includes depositing epitaxial material on portions of the first silicon-based layers 248 within the source/drain region 306 and/or deposition of the source/drains 228 includes depositing epitaxial material on portions of the first silicon-based layers 268 within the source/drain region 308. In some implementations, example implementation 300 includes depositing the top spacers 210 and 230 before depositing the source/drains 208 and 228, respectively. Alternatively, example implementation 300 may include depositing the top spacers 210 and 230 after depositing the source/drains 208 and 228.

Figure 3E:
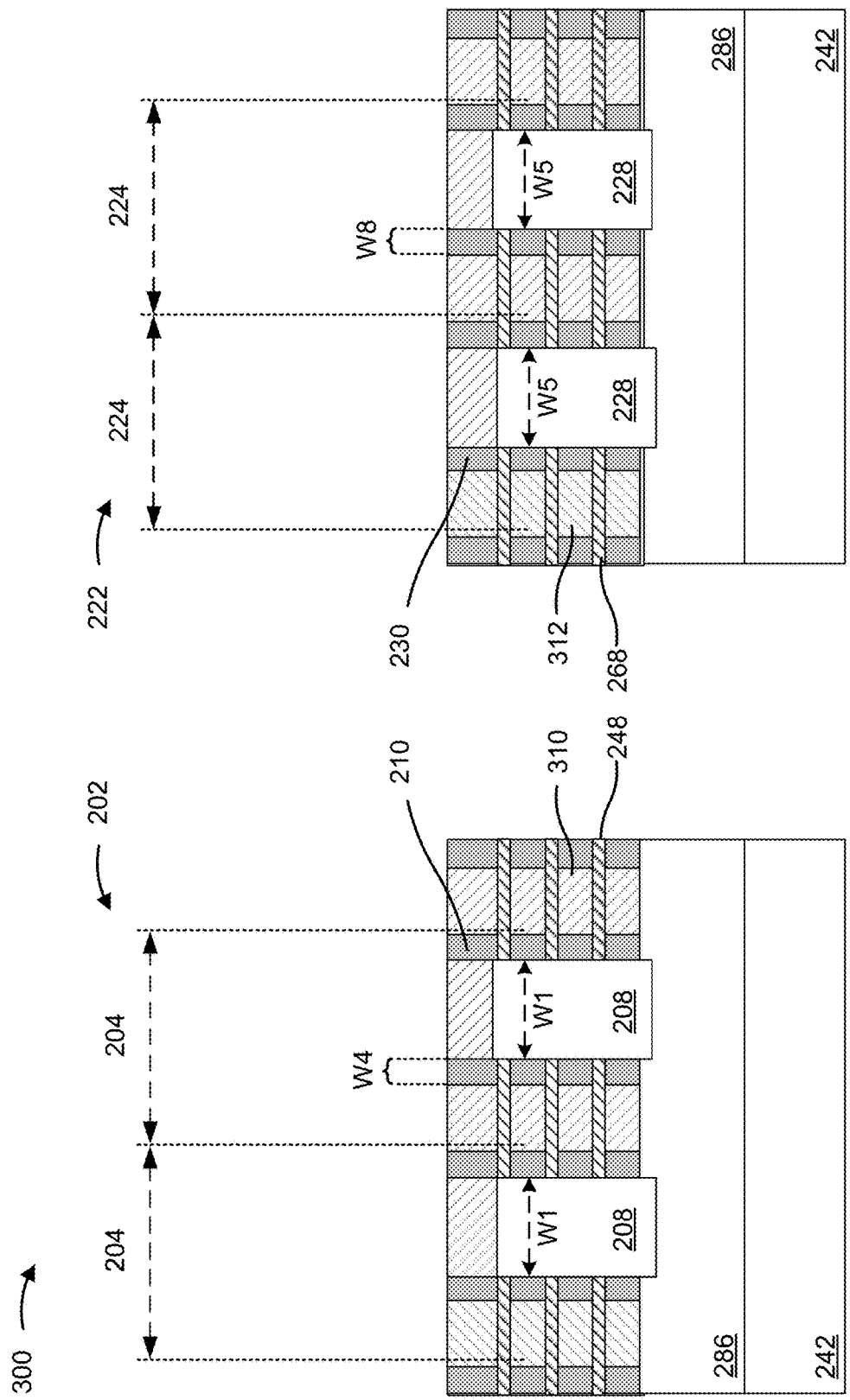

As shown in FIG. 3E, example implementation 300 may include removing portions of the second silicon-based layers 302 and 304 at a gate regions 310 and at a gate regions 312 of the semiconductor device 200. In some implementations, the one or more semiconductor processing tools (e.g., etching tool 104) etch the one or more portions of the second silicon-based layers 302 and 304 using, for example, wet etching with a chemical that is configured to selectively etch material of the second silicon-based layers 302 and 304 and to have reduced etching of the first silicon-based layers 248 relative to the second silicon-based layers 302 and 304. In some implementations, the one or more semiconductor processing tools may perform one or more operations to prevent or reduce etching outside of the gate portion of the semiconductor device 200. For example, a hard mask or a photoresist may be applied to a top surface of the top-most layer of the second silicon-based layers 302 and 304 at regions outside of the gate regions 310 and 312 before etching the portions of the second silicon-based layers 302 and 304 at the gate regions 310 and 312. In some implementations, the portions of the second silicon-based layers 302 and 304 at the gate regions 310 and at the gate regions 312 may be removed before forming the top spacers 210 and 230 and/or the source/drains 208 and 228. In some implementations, a dummy gate may be dispose into the gate regions 310 and 312 after removing the second silicon-based layers 302 and 304 at the gate regions 310 and at the gate regions 312 and before forming the top spacers 210 and 230 and/or the source/drains 208 and 228.

Figure 3F:
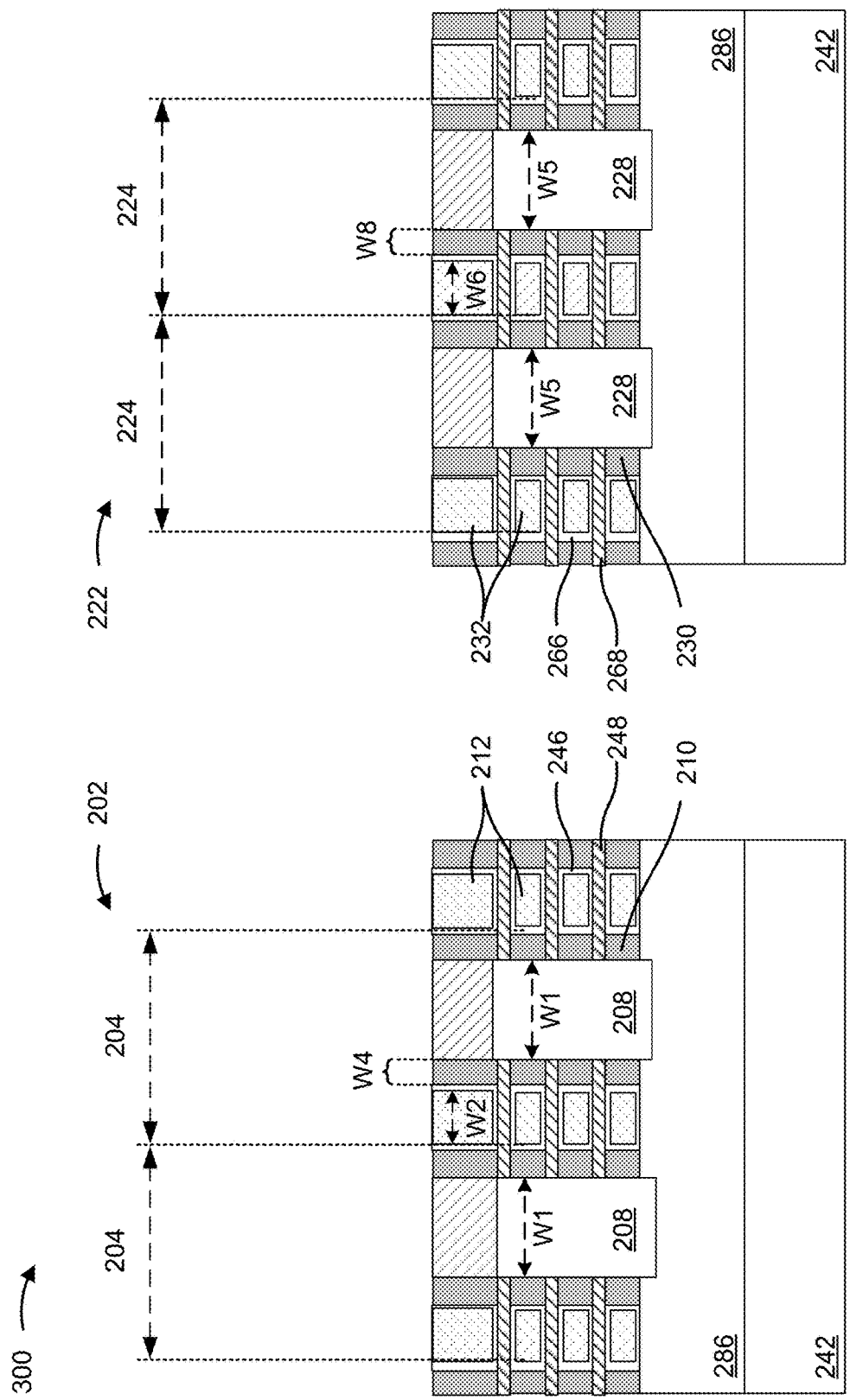

As shown in FIG. 3F, example implementation 300 may include forming gates 212 within the gate regions 310 to surround the channels 248 within the gate regions 310 and may include forming gates 232 within the gate regions 312 to surround the channels 268 within the gate regions 330. Additionally, example implementation 300 may include forming gate dielectric structures 246 between the channels 248 and the gates 212 within the gate regions 310 and forming gate dielectric structures 266 between the channels 268 and the gates 232 within the gate regions 312. In some implementations, the one or more semiconductor processing tools (e.g., deposition tool 102) deposit (e.g., using a chemical vapor deposition or an atomic layer deposition, among other examples) the gate dielectric structures 246 on the channels 248 before depositing the gates 212 (e.g., using a chemical vapor deposition, an atomic layer deposition, and/or a reflow deposition) to fill the gate regions 310. Similarly, the one or more semiconductor processing tools (e.g., deposition tool 102) may deposit (e.g., using a chemical vapor deposition or an atomic layer deposition, among other examples) the gate dielectric structures 266 on the channels 268 before depositing the gates 232 (e.g., using a chemical vapor deposition, an atomic layer deposition, and/or a reflow deposition) to fill the gate regions 312. In some implementations, before depositing material for the gates 212 and 232, the one or more semiconductor processing tools (e.g., etching tool 104) may remove a dummy gate from the gate regions 310 and 312.

In some implementations, the gates 212 and/or 232 include a work function metal deposited between and/or around the channels 248 and/or the channels 268 to form portions of the gates 212 and the gates 232. In some implementations, the work function metal deposited between and/or around the channels 248 and the work function metal deposited between and/or around the channels 268 may be a same work function metal and/or may be deposited in a same set of operations. In some implementations, the one or more semiconductor processing tools (e.g., the deposition tool 102) deposit the work function metal between and/or around the channels 248 and/or the channels 268. In some implementations, the deposition tool 102 uses chemical vapor deposition, physical vapor deposition, and/or reflow, among other examples, to deposit the work function metal. In some implementations, the deposition tool 102 may deposit the work function metal in multiple operations. For example, the deposition tool may deposit a first layer of the work function metal (e.g., a first type of material) using a first deposition technique to coat the channels and/or gate dielectric structures 246 and 266 (e.g., using chemical vapor deposition or physical vapor deposition, among other examples) and may deposit a fill material (e.g., tungsten) of the work function metal using a second deposition technique (e.g., using reflow, among other examples). In some implementations, the work function material may have a width W2 in the first set of GAA structures 202 and a width W6 in the second set of GAA structures 222.

Figure 3G:
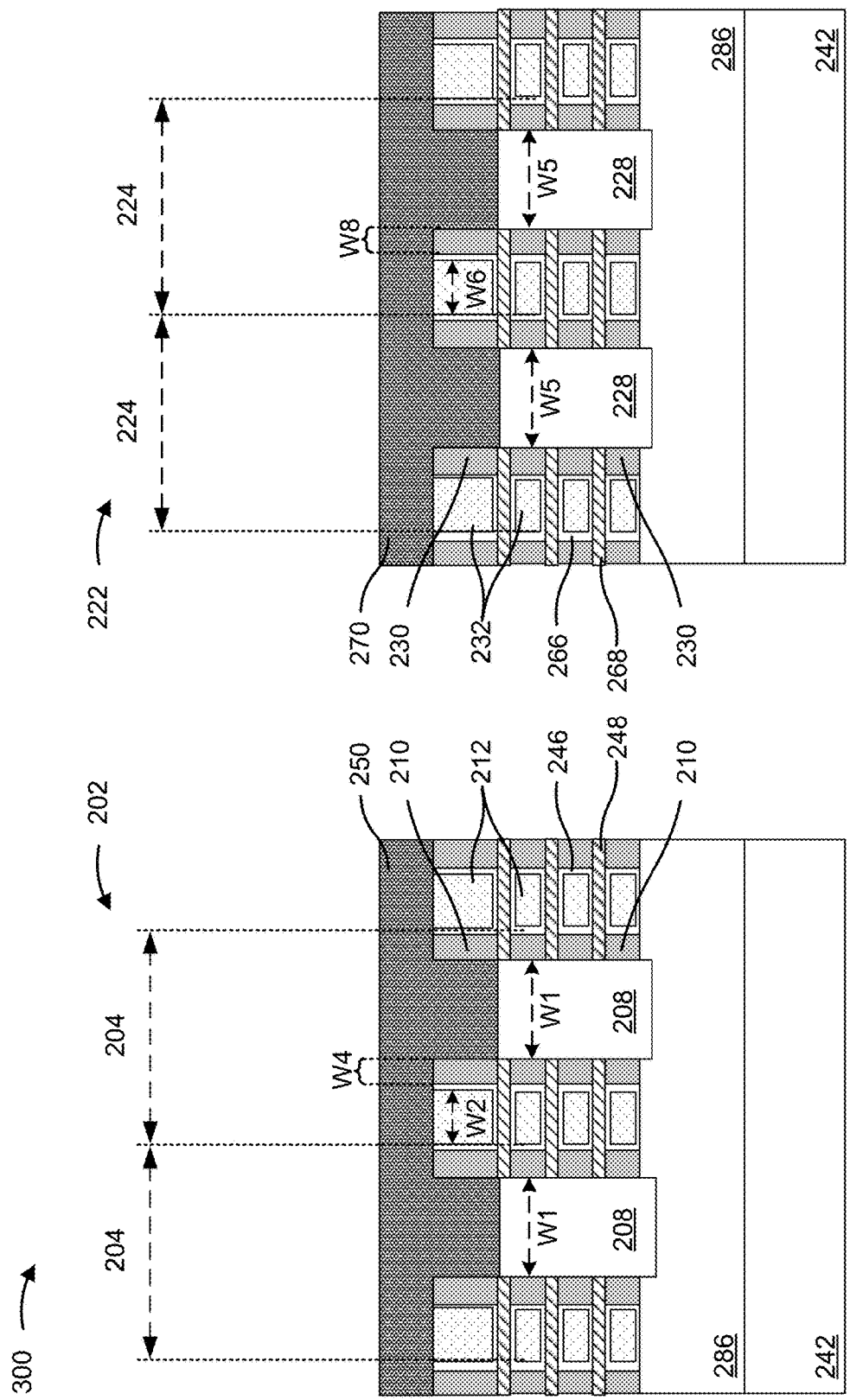
Figure 3H:
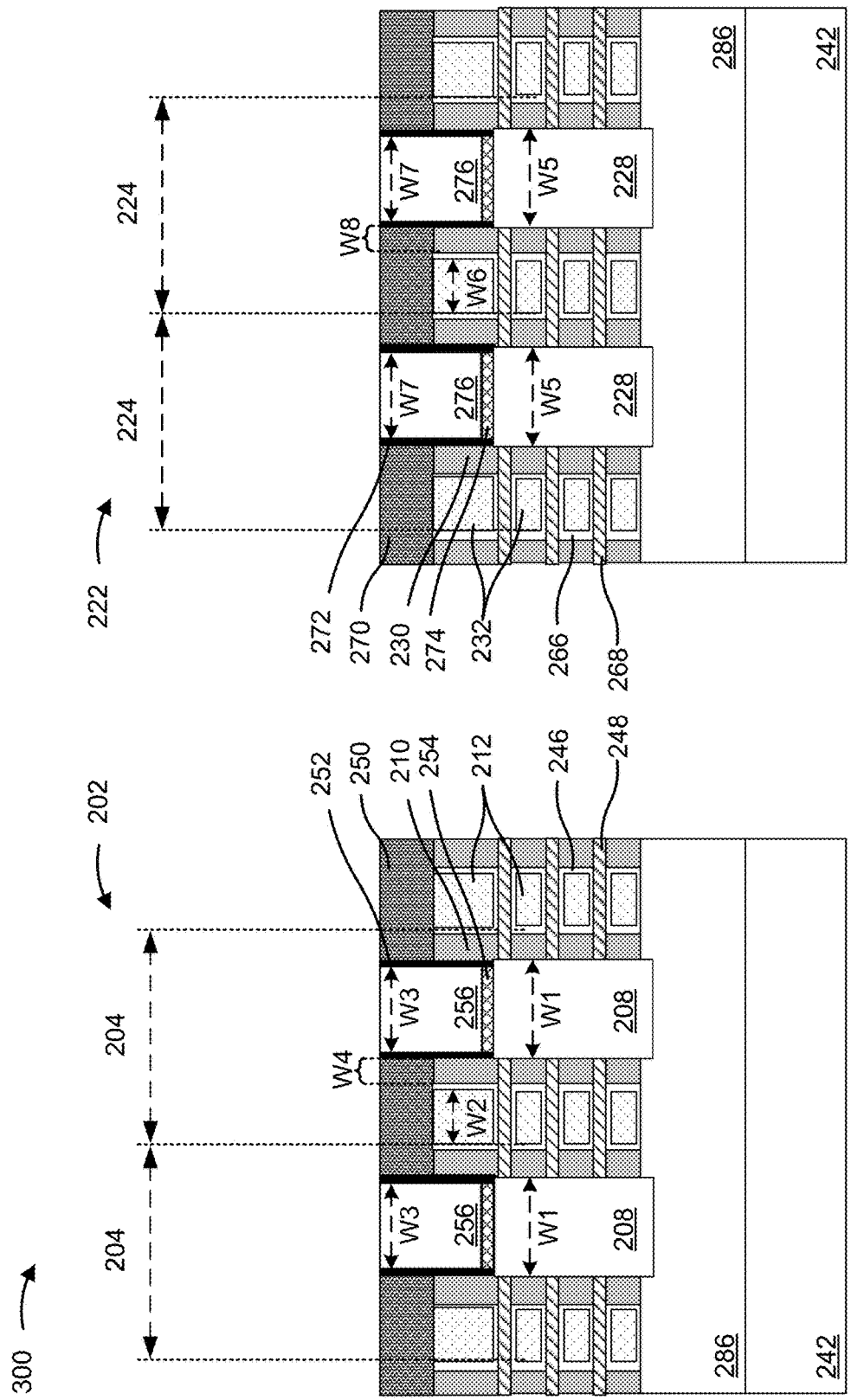

As shown in FIG. 3G, example implementation 300 may include depositing a dielectric layer 250 on a top surface of a top-most gate 212, a top surface of a top spacer 210, and/or a top surface of the source/drains 228, and a dielectric layer 270 may be disposed on a top surface of a top-most gate 232, a top surface of the top spacers 230, and/or a top surface of the source/drains 228. In some implementations, the dielectric layer 250 and the dielectric layer 270 may be a same dielectric material and/or may be disposed in a same operation. In some implementations, the one or more semiconductor processing tools (e.g., the deposition tool 102) deposit the dielectric layer 250 and the dielectric layer 270 using chemical vapor deposition or physical vapor deposition, among other examples.

In some implementations, the one or more semiconductor processing tools (e.g., planarization tool 106) polish and/or planarize a top surface of the dielectric layer 250 and a top surface of the dielectric layer 270. In this way, the top surfaces of the dielectric layer 250 and the dielectric layer 270 may be suitable for depositing additional material of the semiconductor device 200 and/or may improve uniformity of a subsequent etching process.

As shown in FIG. 3F, conductive structures (e.g., including a bottom liner 254, a sidewall liner 252, and/or a contact 256, among other examples) may be disposed into recessed portions of the semiconductor device 200 that extends through the dielectric layer 250 to the source/drains 208. Similarly, conductive structures (e.g., including a bottom liner 274, a sidewall liner 272, and/or a contact 276, among other examples) may be disposed into recessed portions of the semiconductor device 200 that extend through the dielectric layer 270 to the source/drains 228. In some implementations, the bottom liner 254 is formed of a same material and/or using a same deposition operation as the bottom liner 274, the sidewall liner 252 is formed of a same material and/or using a same deposition operation as the sidewall liner 272, and/or the contact 256 is formed of a same material and/or using a same deposition operation as the contact 276. In some implementations, the one or more semiconductor processing tools (e.g., the deposition tool 102) deposit the bottom liner 254, the sidewall liner 252, the contact 256, the bottom liner 274, the sidewall liner 272, and/or the contact 276. In some implementations, the deposition tool 102 uses chemical vapor deposition or physical vapor deposition, among other examples, to deposit the bottom liner 254, the sidewall liner 252, the contact 256, the bottom liner 274, the sidewall liner 272, and/or the contact 276.

In some implementations, the one or more semiconductor processing tools (e.g., planarization tool 106) polish and/or planarize top surfaces of the dielectric layer 250, the contact 256, the sidewall liner 252, the dielectric layer 270, the contact 276, and/or the sidewall liner 272. In this way, the top surfaces of the dielectric layer 250, the contact 256, the sidewall liner 252, the dielectric layer 270, the contact 276 and/or the sidewall liner 272 may be suitable for depositing additional material of the semiconductor device.

Figure 3I:
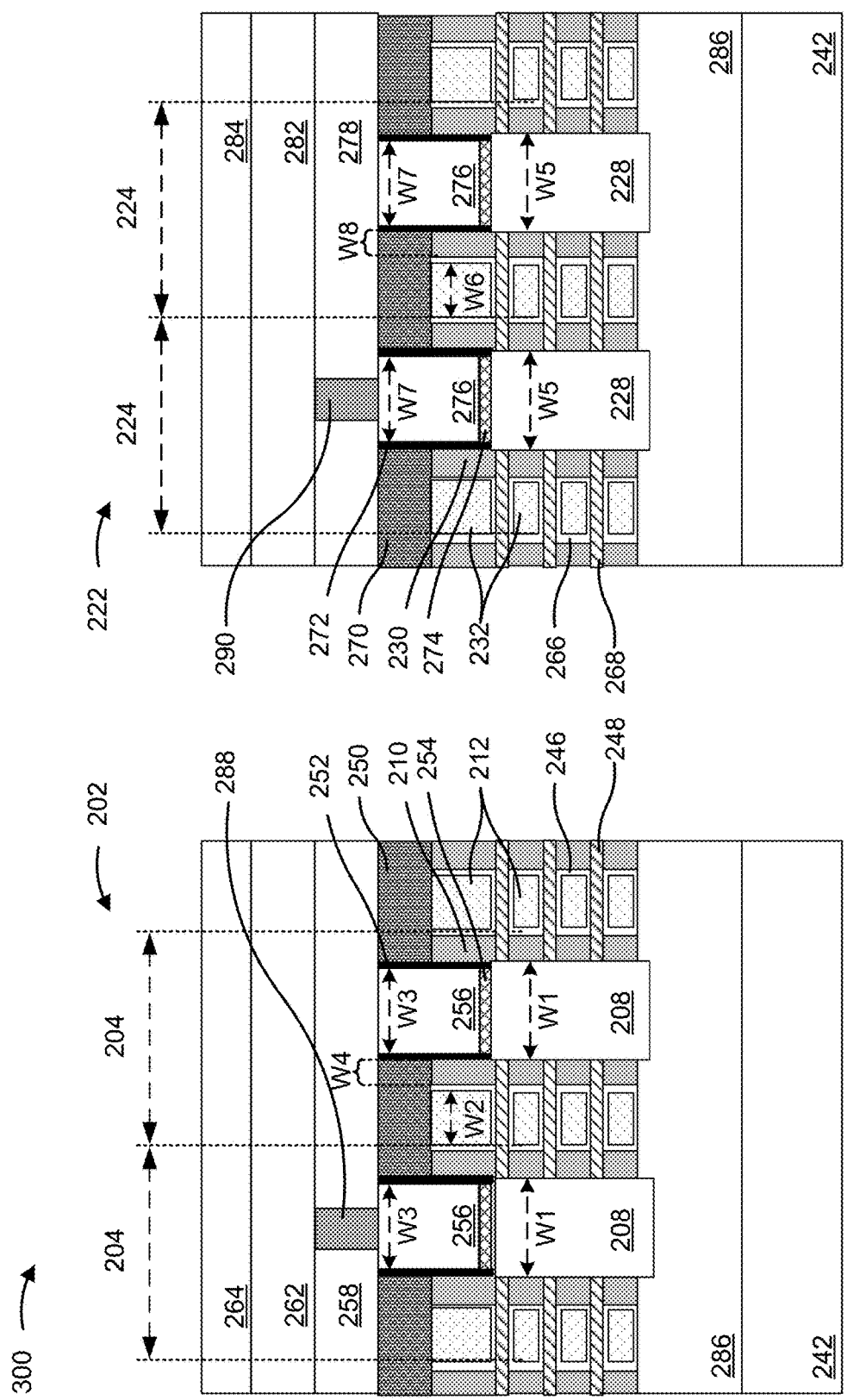

As shown in FIG. 3I, an inter-layer dielectric 258 may be deposited onto top surfaces of the dielectric layer 250, the contact 256, and/or the sidewall liner 252. Similarly, an inter-layer dielectric 278 structure may be deposited onto top surfaces of the dielectric layer 270, the contact 276, and/or the sidewall liner 272. In some implementations, the inter-layer dielectric 258 is formed of a same material and/or using a same deposition operation as the inter-layer dielectric 278. In some implementations, the one or more semiconductor processing tools (e.g., the deposition tool 102) deposit the inter-layer dielectric 258 and the inter-layer dielectric 278. In some implementations, the deposition tool 102 uses chemical vapor deposition or physical vapor deposition, among other examples, to deposit the inter-layer dielectric 258 and the inter-layer dielectric 278.

In some implementations, the one or more semiconductor processing tools (e.g., planarization tool 106) polish and/or planarize top surfaces of the inter-layer dielectric 258 and the inter-layer dielectric 278. In this way, the top surfaces of the inter-layer dielectric 258 and the inter-layer dielectric 278 may be suitable for depositing additional material of the semiconductor device 200 and/or may improve uniformity of a subsequent etching process.

As also shown in FIG. 3I, a conductive structure 288 (e.g., a source/drain via) may be deposited through the inter-layer dielectric 258 to provide an electrical connection to the contact 256 through the inter-layer dielectric 258. Similarly, a conductive structure 290 (e.g., a source/drain via) may be deposited through the inter-layer dielectric 278 to provide an electrical connection to the contact 276 through the inter-layer dielectric 278. In some implementations, the one or more semiconductor processing tools (e.g., the etching tool 104) etch portions of the inter-layer dielectric 258 and the inter-layer dielectric 278 to provide a recessed portion into which the conductive structure 288 and the conductive structure 290 may be deposited, respectively. In some implementations, the one or more processing tools (e.g., the deposition tool 102) deposit the inter-layer dielectric 258 and the inter-layer dielectric 278 into the recessed portions of the inter-layer dielectric 258 and the inter-layer dielectric 278, respectively. In some implementations, the deposition tool 102 uses chemical vapor deposition or physical vapor deposition, among other examples, to deposit the inter-layer dielectric 258 and the inter-layer dielectric 278.

In some implementations, the one or more semiconductor processing tools (e.g., planarization tool 106) polish and/or planarize top surfaces of the inter-layer dielectric 258, the conductive structure 288, the inter-layer dielectric 278, and the conductive structure 280. In this way, the top surfaces of the inter-layer dielectric 258, the conductive structure 288, the inter-layer dielectric 278, and the conductive structure 280 may be suitable for depositing additional material of the semiconductor device.

As further shown in FIG. 3I, a conductive structure 262 (e.g., having multiple elements coupled to different portions of the semiconductor device 200) may be deposited onto top surfaces of the inter-layer dielectric 258 and the conductive structure 288 to provide an electrical connection to the conductive structure 288. Similarly, conductive structure 282 may be deposited onto top surfaces of the inter-layer dielectric 278 and the conductive structure 290. In some implementations, the conductive structure 262 is formed of a same material and/or using a same deposition operation as the conductive structure 282. In some implementations, the inter-metal dielectric 264 is formed of a same material and/or using a same deposition operation as the inter-metal dielectric 284. In some implementations, the deposition tool 102 uses chemical vapor deposition or physical vapor deposition, among other examples, to deposit the conductive structure 262 the conductive structure 282, the inter-metal dielectric 264, and the inter-metal dielectric 284.

As additionally shown in FIG. 3I, an inter-metal dielectric 264 may be deposited onto the conductive structure 262 and/or between elements of the conductive structure 262 to provide electrical isolation between the elements of conductive structure 262. Similarly, an inter-metal dielectric 284 may be deposited onto the conductive structure 282 and/or between elements of the conductive structure 282 to provide electrical isolation between the elements of conductive structure 282. In some implementations, the inter-metal dielectric 264 is formed of a same material and/or using a same deposition operation as the inter-metal dielectric 284. In some implementations, the one or more semiconductor processing tools (e.g., the deposition tool 102) deposit the inter-metal dielectric 264 and the inter-metal dielectric 284. In some implementations, the deposition tool 102 uses chemical vapor deposition or physical vapor deposition, among other examples, to deposit the inter-metal dielectric 264 and the inter-metal dielectric 284.

In some implementations, the one or more semiconductor processing tools (e.g., planarization tool 106) polish and/or planarize top surfaces of the inter-metal dielectric 264 and the inter-metal dielectric 284. In this way, the top surfaces of the inter-metal dielectric 264 and the inter-metal dielectric 284 may be suitable for depositing additional material of the semiconductor device 200.

As indicated above, FIGS. 3A-3I are provided as an example. Other examples may differ from what is described with regard to FIGS. 3A-3I. For example, an order of forming the channels 248 and/or 268 and for forming the gates 212 and/or 232 may differ from that described in connection with FIGS. 3A-3I. For example, the gates 212 and/or 232 may be formed in layers along with the channels 248 and/or 268 instead of the gates 212 and/or 232 being formed after all of the channels 248 and/or 268 are formed.

Figure 4A:
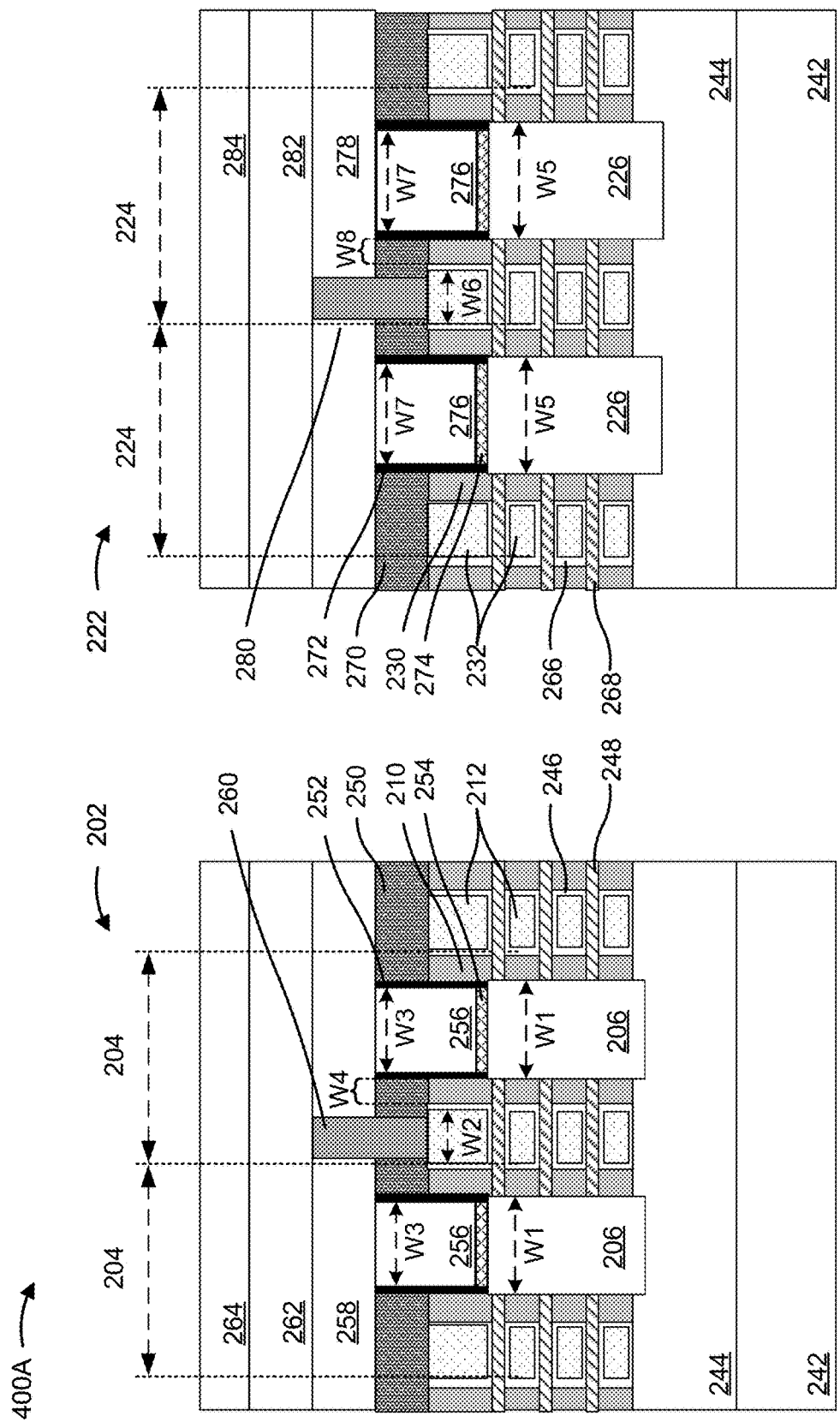
FIGS. 4A-4C are diagrams of example semiconductor structures described herein.
Figure 4B:
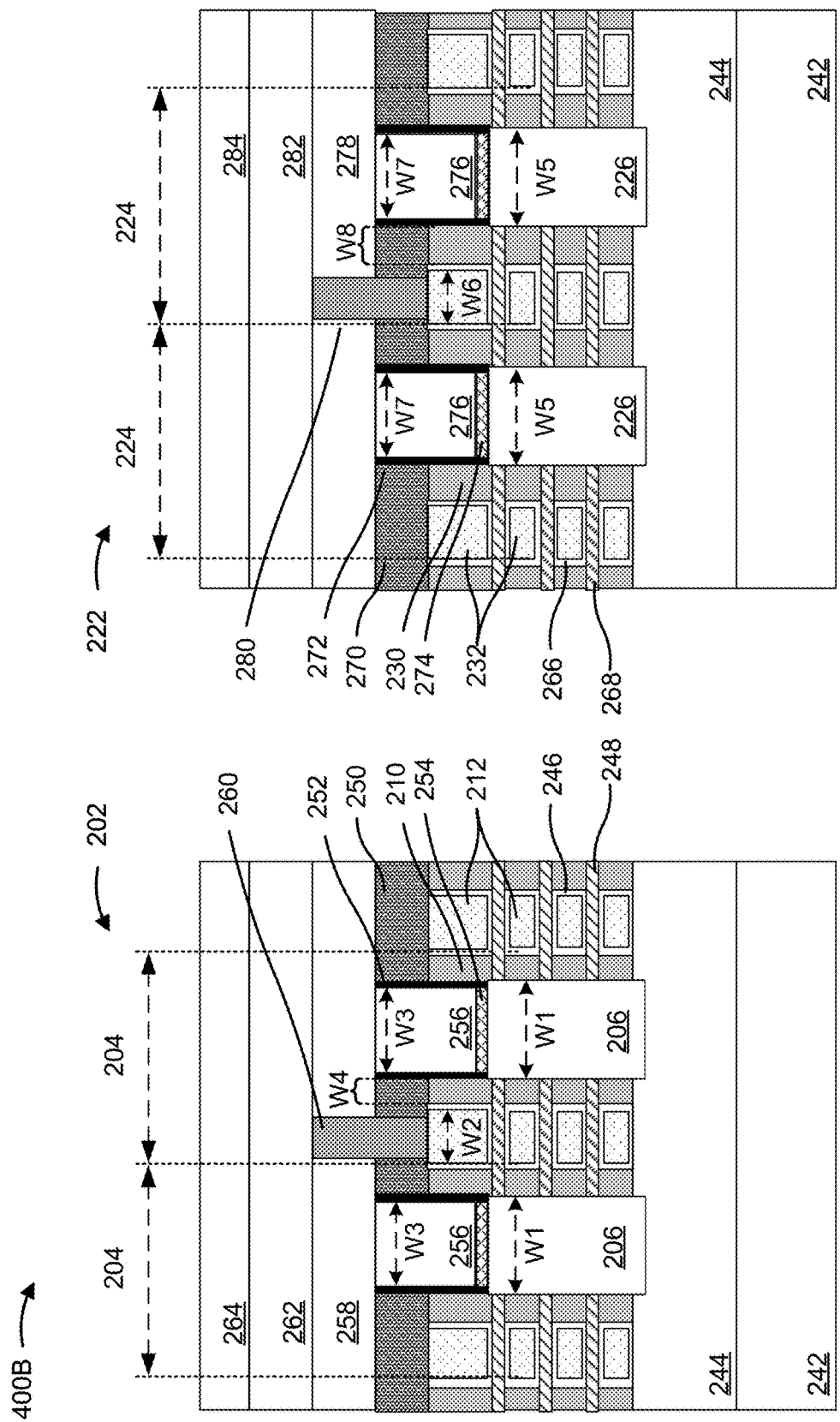
Figure 4C:
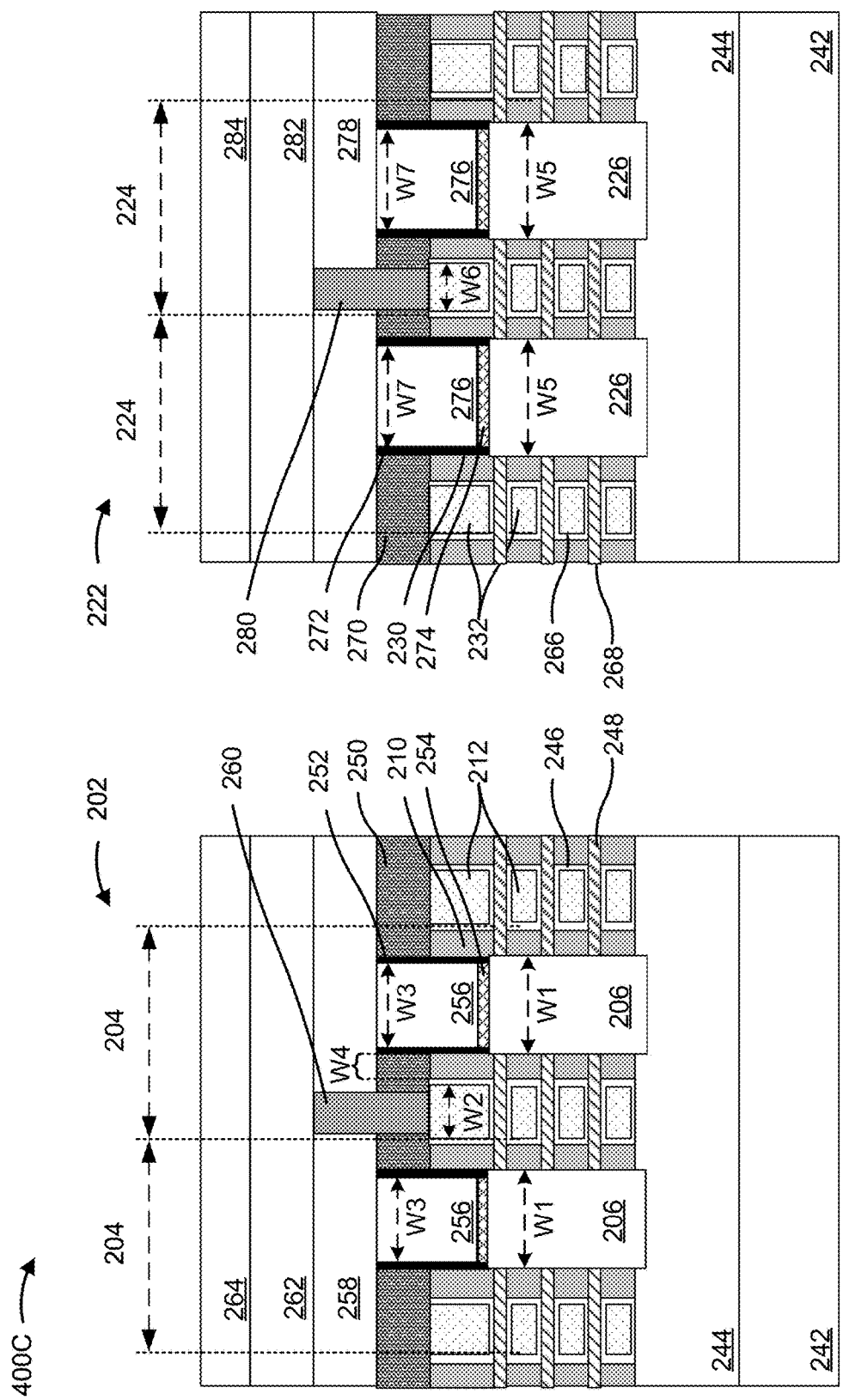

FIGS. 4A-4C are diagrams of example semiconductor devices 400A-400C described herein. The example semiconductor devices 400A-400C are examples of the semiconductor device 200 shown in FIGS. 2A-3I and include some or all of the same structures of the semiconductor device 200. The example semiconductor devices 400A-400C may include alternative dimensions of elements, which alternatives optimize the example semiconductor devices 400A-400C for different applications.

As shown in FIG. 4A, semiconductor device 400A includes source/drains 206 (and source/drains 208 not shown) having the width W5 that is greater than the width W1 of source/drains 206 (and source/drains 208 not shown). The width W5 may be in a range of approximately 105% to approximately 140% of the width W1. Additionally, the source/drains 206 and/or 208 may have a first doping concentration that is less than a second doping concentration of the second set of source/drains 226 and/or 228. In some implementations, N-doped source/drains of the set of GAA structures 222 may have a doping concentration (e.g., with phosphorus) that is in a range of approximately 140% to approximately 300% of a doping concentration of N-doped source/drains of the set of GAA structures 202. Additionally, or alternatively, P-doped source/drains of the set of GAA structures 222 may have a doping concentration (e.g., with boron) that is in a range of approximately 150% to approximately 500% of a doping concentration of P-doped source/drains of the set of GAA structures 202. In some aspects, the GAA structures 202 may include a doping concentration (e.g., of boron), in a set of source/drains, in a range of approximately $(10^{19}$ elements$)$/centimeter$^3$ to approximately $(6 \times 10^{20}$ elements$)$/centimeter$^3$.

In this way, conductivities of the source/drains 226 and/or 228 may be greater than the conductivities of the source/drains 206 and 208. In some implementations, the source/drains 226 and/or 228 are disposed into the P_Well 244 with a depth that is greater than a depth at which the source/drains 206 and/or 208 are disposed into the P_Well 244. For example, the source/drains 226 and/or 228 may be disposed at a depth that is in a range of approximately 103% to 110% of a depth at which the source/drains 206 and/or 208 are disposed into the P_Well 244 and/or at a depth that is in a range of approximately 3 nanometers to approximately 10 nanometers deeper than the depth at which the source/drains 206 and/or 208 are disposed into the P_Well 244. These features may increase a conductivity between the source/drains 226 and/or 228 with the P_Well 244 relative to a conductivity between the source/drains 206 and/or 208 with the P_Well 244. Based on increasing conductivity, a resistance (e.g., for operations of the set of GAA structures 222) of the set of GAA structures 222 relative to the set of GAA structures 202 is reduced. Additionally, or alternatively, the width W7 of the contact 276 may be greater than the width W3 of the contact 256 to reduce a resistance between the conductive structure 288 and the source/drains 208. For example, the width W7 may be in a range of 110% to approximately 200% of the width W3. In this way, the resistance of the set of GAA structures 222 relative to the set of GAA structures 202 may be further reduced.

In some implementations, based on the width W5 being greater than the width W1, the gate pitch 224 is greater than the gate pitch 204. In some implementations, the width W4 of the top spacers 210 is approximately equal to the width W8 of the top spacers 230 and/or the width W2 of the gates 212 is approximately equal to the width W6 of the gates 232. Alternatively, the width W8 may be larger than the width W4 by an amount in a range of approximately 0.5 nanometers to approximately 5 nanometers to increase an amount by which the gate pitch 224 is greater than the gate pitch 204 and to reduce an amount of leakage from the set of GAA devices 222.

Based on the gate pitch 224 being greater than the gate pitch 204, the width W5 being greater than the width W1, and/or a doping concentration of the source/drains 226 and 228 being greater than the doping concentrations of the source/drains 206 and 208, a resistance of the set of GAA structures 222 of semiconductor device 400A may be reduced (e.g., based on improved ionization within the set of GAA structures 222) to optimize for low Vt applications, and the GAA structures 202 of semiconductor device 400A are optimized for high density and/or low leakage applications.

As shown in FIG. 4B, the gate pitch 224 is greater than the gate pitch 204 based on the width W8 of the top spacers 230 being greater than the width W4 of the top spacers 210. For example, the gate pitch 224 is in a range of approximately 105% to approximately 140% of the gate pitch 204. Additionally, or alternatively, the width W8 may be in a range of approximately 110% to approximately 200% of the width W4. In some implementations, the width W2 may be approximately equal to the width W6.

Additionally, the source/drains 206 and/or 208 may have a first doping concentration that is less than a second doping concentration of the second set of source/drains 226 and/or 228. In some implementations, N-doped source/drains of the set of GAA structures 222 may have a doping concentration (e.g., with phosphorus) that is in a range of approximately 140% to approximately 300% of a doping concentration of N-doped source/drains of the set of GAA structures 202. Additionally, or alternatively, P-doped source/drains of the set of GAA structures 222 may have a doping concentration (e.g., with boron) that is in a range of approximately 150% to approximately 500% of a doping concentration of P-doped source/drains of the set of GAA structures 202. In this way, conductivities of the source/drains 226 and/or 228 may be greater than the conductivities of the source/drains 206 and 208. In some implementations, the source/drains 226 and/or 228 are disposed into the P_Well 244 with a depth that is greater than a depth at which the source/drains 206 and/or 208 are disposed into the P_Well 244. For example, the source/drains 226 and/or 228 may be disposed at a depth that is in a range of approximately 103% to 110% of a depth at which the source/drains 206 and/or 208 are disposed into the P_Well 244 and/or at a depth that is in a range of approximately 3 nanometers to approximately 10 nanometers deeper than the depth at which the source/drains 206 and/or 208 are disposed into the P_Well 244. These features may increase a conductivity between the source/drains 226 and/or 228 with the P_Well 244 relative to a conductivity between the source/drains 206 and/or 208 with the P_Well 244. Based on increasing conductivity, a resistance (e.g., for operations of the set of GAA structures 222) of the set of GAA structures 222 relative to the set of GAA structures 202 is reduced. Additionally, or alternatively, the width W7 may be greater than the width W3 to reduce a resistance between the conductive structure 288 and the source/drains 208 (shown in FIG. 2C). For example, the width W7 may be in a range of 110% to approximately 200% of the width W3. In this way, the resistance of the set of GAA structures 222 relative to the set of GAA structures 202 may be further reduced. Further, a first capacitance associated with the top spacers 210 and corresponding first gate contacts 260 may be greater than a second capacitance associated with the second set of top spacers 230 and corresponding second gate contacts 280.

Based on the gate pitch 224 being greater than the gate pitch 204, the width W8 being greater than the width W4, and/or a doping concentration of the source/drains 226 and 228 being greater than the doping concentrations of the source/drains 206 and 208, a contact to gate capacitance may be reduced for the set of GAA structures 222 and a gate-contact breakage voltage may be improved, and the GAA structures 202 are optimized for high density and reduced contact resistance and/or reduced Vt (e.g., based on having a thinner spacer) applications.

As shown in FIG. 4C, the width W6 of the gates 232 is less than the width W2 of the gates 212 and the width W5 of the source/drains 226 is greater than the width W1 of the source/drains 206. Additionally, the gate pitch 204 may be approximately equal to the gate pitch 224. In some implementations, the width W2 is in a range of approximately 105% to approximately 240% of the width W6. The width W2 may have a width in a range of approximately 8 nanometers to approximately 20 nanometers and/or the width W6 may have a width in a range of approximately 8 nanometers to approximately 16 nanometers. In some implementations, the source/drains 226 and 228 have doping concentrations that are greater than doping concentrations of the source/drains 206 and 208. In some implementations, the source/drains 226 and/or 228 are disposed into the P_Well 244 with a depth that is greater than a depth at which the source/drains 206 and/or 208 are disposed into the P_Well 244. For example, the source/drains 226 and/or 228 may be disposed at a depth that is in a range of approximately 103% to 110% of a depth at which the source/drains 206 and/or 208 are disposed into the P_Well 244 and/or at a depth that is in a range of approximately 3 nanometers to approximately 10 nanometers deeper than the depth at which the source/drains 206 and/or 208 are disposed into the P_Well 244. These features may increase a conductivity between the source/drains 226 and/or 228 with the P_Well 244 relative to a conductivity between the source/drains 206 and/or 208 with the P_Well 244. Based on increasing conductivity, a resistance (e.g., for operations of the set of GAA structures 222) of the set of GAA structures 222 relative to the set of GAA structures 202 is reduced. Additionally, or alternatively, the width W7 may be greater than the width W3 to reduce a resistance between the conductive structure 288 and the source/drains 208. For example, the width W7 may be in a range of 110% to approximately 200% of the width W3. In this way, the resistance of the set of GAA structures 222 relative to the set of GAA structures 202 may be further reduced. Further, based on the gate pitch 204 being approximately equal to the gate pitch 224, the set of GAA structures 222 may have a decreased resistance without decreasing a device density relative to the set of GAA structures 202.

In some implementations, N-doped source/drains of the set of GAA structures 222 may have a doping concentration (e.g., with phosphorus) that is in a range of approximately 140% to approximately 300% of a doping concentration of N-doped source/drains of the set of GAA structures 202. Additionally, or alternatively, P-doped source/drains of the set of GAA structures 222 may have a doping concentration (e.g., with boron) that is in a range of approximately 150% to approximately 500% of a doping concentration of P-doped source/drains of the set of GAA structures 202. In this way, conductivities of the source/drains 226 and/or 228 may be greater than the conductivities of the source/drains 206 and 208.

Based on the gate pitch 224 being approximately equal to the gate pitch 204, the width W6 being less than the width W2, and/or a doping concentration of the source/drains 226 and 228 being greater than the doping concentrations of the source/drains 206 and 208, a resistance of the set of GAA structures 222 may be reduced (e.g., based on improved ionization within the set of GAA structures 222) to optimize for low Vt applications, and the GAA structures 202 are optimized for low leaking, high Vt, and low power circuit applications.

As indicated above, FIGS. 4A-4C are provided as examples. Other examples may differ from what is described with regard to FIGS. 4A-4C.

Figure 5:
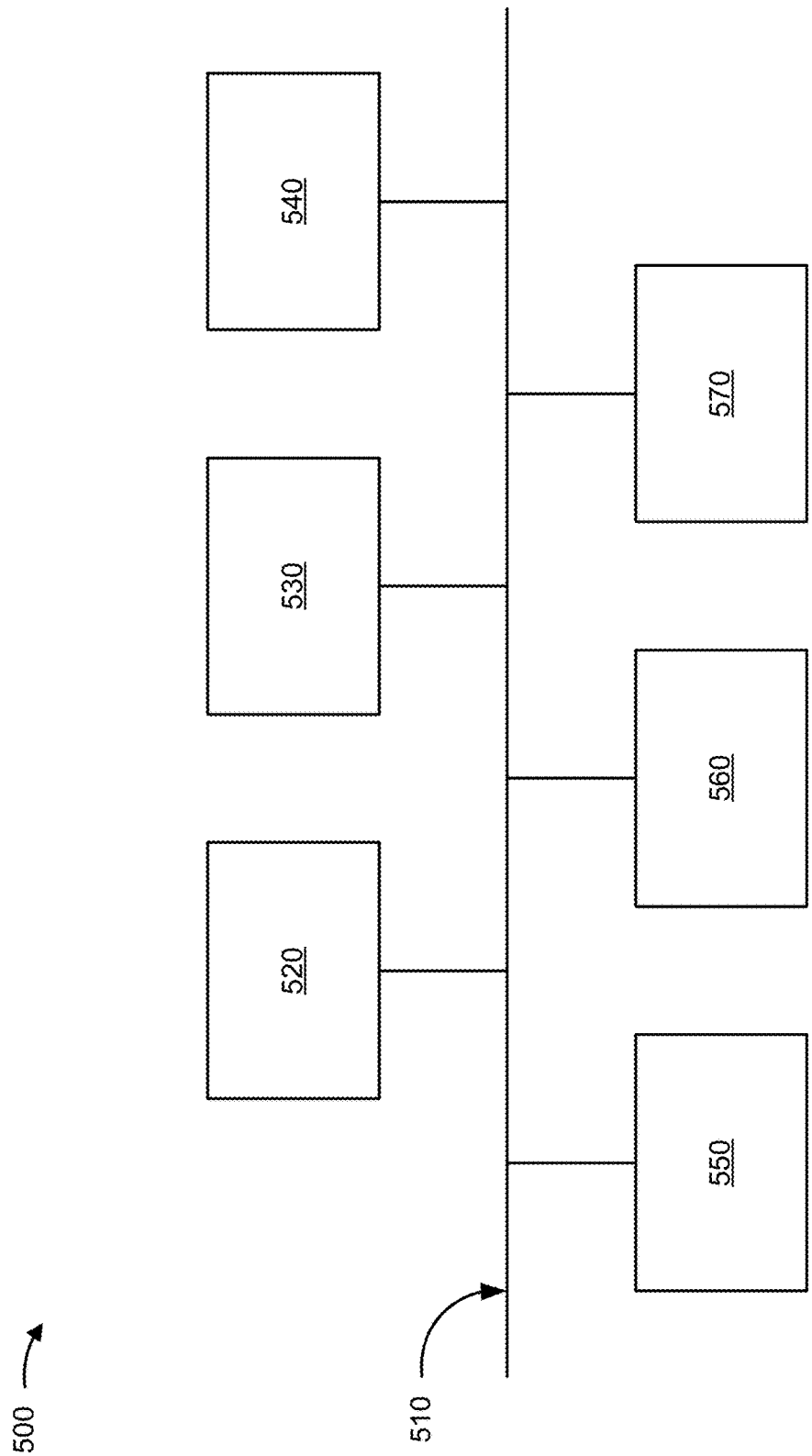
FIG. 5 is a diagram of example components of one or more devices of FIG. 1 described herein.

FIG. 5 is a diagram of example components of a device 500, which may correspond to the deposition tool 102, the etching tool 104, the planarization tool 106, the ion implantation tool 108, and/or the wafer/die transport tool 110. In some implementations, the deposition tool 102, the etching tool 104, the planarization tool 106, the ion implantation tool 108, and/or the wafer/die transport tool 110 may include one or more devices 500 and/or one or more components of device 700. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
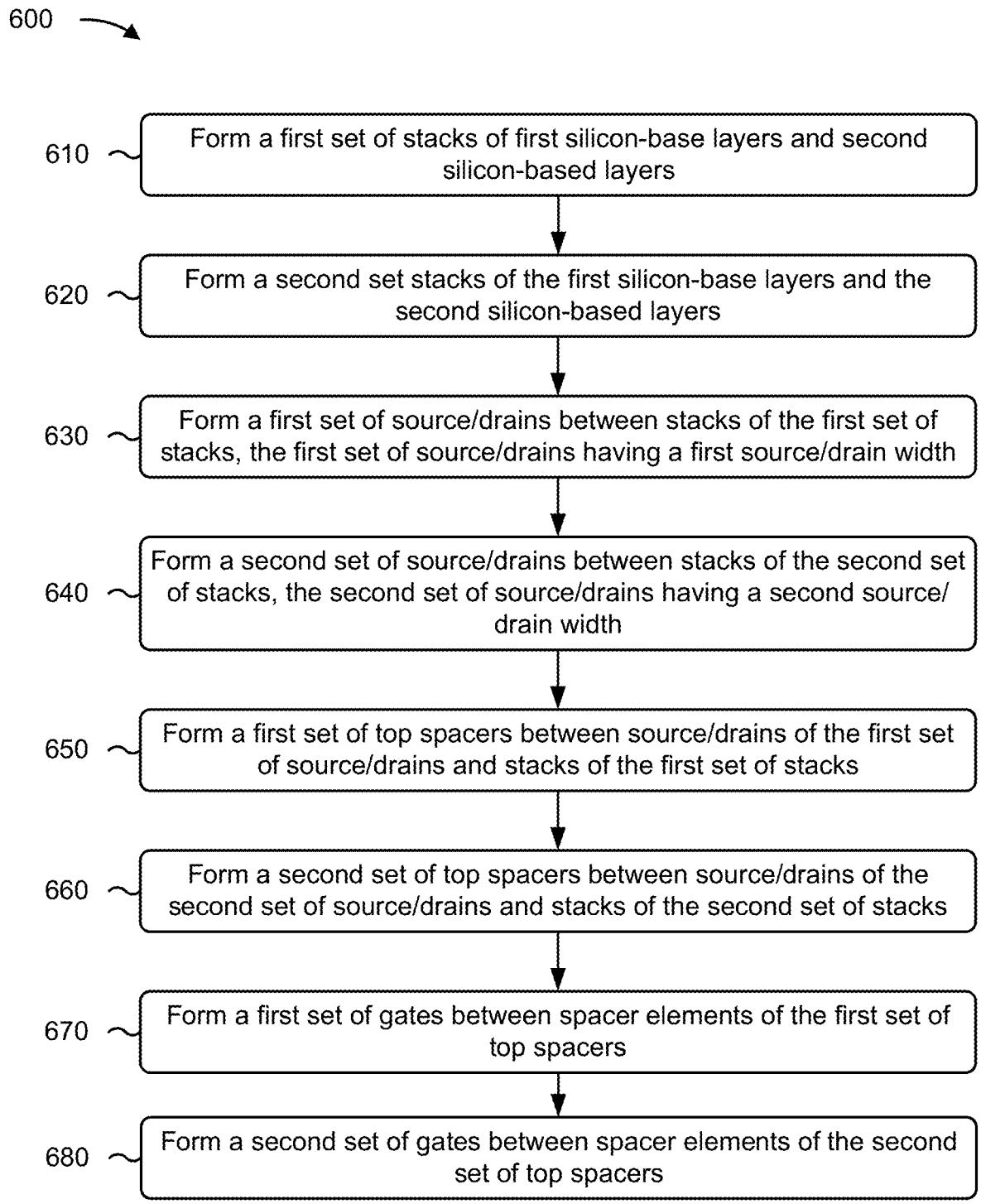
FIG. 6 is a flowchart of an example process relating to forming gate-all-around structures.

FIG. 6 is a flowchart of an example process 600 relating to forming GAA structures. In some implementations, one or more process blocks of FIG. 6 may be performed by one or more semiconductor processing tools (e.g., deposition tool 102, etching tool 104, planarization tool 106, ion implantation tool 108, and/or wafer/die transport tool 110). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may forming a first set of stacks of first silicon-base layers and second silicon-based layers (block 610). For example, the one or more semiconductor processing tools may form the first set of stacks (e.g., of the set of GAA structures 202) of first silicon-base layers 248 and second silicon-based layers 302 and 304, as described above.

As further shown in FIG. 6, process 600 may forming a second set stacks of the first silicon-base layers and the second silicon-based layers (block 620). For example, the one or more semiconductor processing tools may form the second set of stacks (e.g., of the set of GAA structures 222) of first silicon-base layers 248 and second silicon-based layers 302 and 304, as described above.

As further shown in FIG. 6, process 600 may forming a first set of source/drains between stacks of the first set of stacks, the first set of source/drains having a first source/drain width (block 630). For example, the one or more semiconductor processing tools may form the first set of source/drains 208 between stacks of the first set of stacks, the first set of source/drains 208 having a first source/drain width W1, as described above.

As further shown in FIG. 6, process 600 may forming a second set of source/drains between stacks of the second set of stacks, the second set of source/drains having a second source/drain width (block 640). For example, the one or more semiconductor processing tools may form the second set of source/drains 228 between stacks of the first set of stacks, the first set of source/drains 228 having a second source/drain width W5, as described above.

As further shown in FIG. 6, process 600 may forming a first set of top spacers between source/drains of the first set of source/drains and stacks of the first set of stacks (block 630). For example, the one or more semiconductor processing tools may form the first set of top spacers 210 between source/drains of the first set of source/drains 208 and stacks of the first set of stacks, as described above.

As further shown in FIG. 6, process 600 may forming a second set of top spacers between source/drains of the second set of source/drains and stacks of the second set of stacks (block 640). For example, the one or more semiconductor processing tools may form the second set of top spacers 230 between source/drains of the second set of source/drains 228 and stacks of the second set of stacks, as described above.

As further shown in FIG. 6, process 600 may forming a first set of gates between spacer elements of the first set of top spacers (block 630). For example, the one or more semiconductor processing tools may form the gates 212 between spacer elements of the first set of top spacers 210, as described above.

As further shown in FIG. 6, process 600 may forming a second set gates between spacer elements of the second set of top spacers (block 640). For example, the one or more semiconductor processing tools may form the second set of gates 232 between spacer elements of the first set of top spacers 230, as described above. In some implementations, the first set of top spacers 210 have a first spacer width W4 and the second set of top spacers 230 have a second spacer width W8. In some implementations, the first set of gates 212 have a first gate width W2 and the second set of gates 32 have a second gate width W6. In some implementations, the first set of gate-all-around (GAA) structures 202, including the first set of source/drains 208, the first set of top spacers 210, and the first set of gates 212, is configured with a first threshold voltage. In some implementations, a second set of GAA structures 222, including the second set of source/drains 228, the second set of top spacers 230, and the second set of gates 232, is configured with a second threshold voltage. In some implementations, the first threshold voltage is different from the second threshold voltage based on one or more of the second source/drain width W5 being different from the first source/drain width W1, the second spacer width W8 being different from the first spacer width W4, or the second gate width W6 being different from the first gate width W2.

Process 600 may include additional implementations, such as any single implementation or any combination of implementations described below and/or in connection with one or more other processes described elsewhere herein.

In a first implementation, forming the first set of source/drains between the stacks of the first set of stacks includes removing, at a source/drain region, the first silicon-based layers or the second silicon-based layers to form a remaining portion of the first set of stacks at the source/drain region, and depositing a epitaxial material on the remaining portion of the first set of stacks at the source/drain region.

In a second implementation, alone or in combination with the first implementation, forming the first set of gates between spacer elements of the first set of top spacers includes removing, at a gate region, the first silicon-based layers or the second silicon-based layers to form a remaining portion of the first set of stacks at the gate region, and depositing a gate material on the remaining portion of the first set of stacks at the gate region.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a semiconductor device may be formed with a first set of GAA structures configured with a first Vt and a second set of GAA structures configured with a second Vt without a need to deposit and remove layers of the GAA structures separately for the first set of GAA structures and the second set of GAA structures based on dimensions (e.g., widths and not thicknesses) of the first set of GAA structures differing from dimensions of the second set of gate structures. This may allow the first set of GAA structures to be optimized for a first application and the second set of GAA structures to be optimized for a second application in a way that reduces and/or avoids process limitations that would otherwise be associated with forming the first set of GAA structures and the second set of GAA structures separately using additional depositions and removals of layers having different thicknesses.

As described in greater detail above, some implementations described herein provide a semiconductor device. The semiconductor device includes a first set of GAA structures having a first gate pitch. The first set of GAA structures includes a first set of source/drains having a first source/drain width and a first set of top spacers, having a first spacer width, disposed between a first set of gates of the first set of GAA structures and the first set of source/drains. The semiconductor device includes a second set of GAA structures having a second gate pitch. The second set of GAA structures includes a second set of source/drains having a second source/drain width and a second set of top spacers, having a second spacer width, disposed between a second set of gates of the second set of GAA structures and the second set of source/drains. The second gate pitch is greater than the first gate pitch based on one or more of the second source/drain width being greater than the first source/drain width, or the second spacer width being greater than the first spacer width.

As described in greater detail above, some implementations described herein provide a semiconductor device. The semiconductor device includes a first set of GAA structures having a first gate pitch. The first set of GAA structures includes a first set of source/drains having a first doping concentration. The semiconductor device includes a second set of GAA structures having a second gate pitch that is a same gate pitch as the first gate pitch. The second set of GAA structures includes a second set of source/drains having a second doping concentration that is greater than the first doping concentration.

As described in greater detail above, some implementations described herein provide a method of manufacturing a semiconductor device. The method includes forming a first set of stacks of first silicon-base layers and second silicon-based layers. The method also includes forming a second set stacks of the first silicon-base layers and the second silicon-based layers. The method further includes forming a first set of source/drains between stacks of the first set of stacks, the first set of source/drains having a first source/drain width. The method additionally includes forming a second set of source/drains between stacks of the second set of stacks with the second set of source/drains having a second source/drain width. The method also includes forming a first set of top spacers between source/drains of the first set of source/drains and stacks of the first set of stacks. The method further includes forming a second set of top spacers between source/drains of the second set of source/drains and stacks of the second set of stacks. The method additionally includes forming a first set of gates between spacer elements of the first set of top spacers. The method also includes forming a second set of gates between spacer elements of the second set of top spacers. The first set of top spacers have a first spacer width and the second set of top spacers have a second spacer width, the first set of gates have a first gate width and the second set of gates have a second gate width. A first set of GAA structures, including the first set of source/drains, the first set of top spacers, and the first set of gates, is configured with a first threshold voltage. A second set of GAA structures, including the second set of source/drains, the second set of top spacers, and the second set of gates, is configured with a second threshold voltage. The first threshold voltage is different from the second threshold voltage based on the second source/drain width being different from the first source/drain width, the second spacer width being different from the first spacer width, and/or the second gate width being different from the first gate width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first set of gate-all-around (GAA) structures having a first gate pitch, the first set of GAA structures including:
        a first set of source/drains having a first source/drain width, and
        a first set of top spacers, having a first spacer width, disposed between a first set of gates of the first set of GAA structures and the first set of source/drains; and
    a second set of GAA structures having a second gate pitch, the second set of GAA structures including:
        a second set of source/drains having a second source/drain width, and
        a second set of top spacers, having a second spacer width, disposed between a second set of gates of the second set of GAA structures and the second set of source/drains,
    wherein the second gate pitch is greater than the first gate pitch based on one or more of:
        the second source/drain width being greater than the first source/drain width, or
        the second spacer width being greater than the first spacer width.

2. The semiconductor device of claim 1, wherein the second source/drain width is greater than the first source/drain width, and
    wherein the first set of source/drains has a first doping concentration that is less than a second doping concentration of the second set of source/drains.

3. The semiconductor device of claim 2, wherein one or more of:
    the second doping concentration is within a range of approximately 150% of the first doping concentration to approximately 500% of the first doping concentration, or
    a first threshold voltage associated with the first set of GAA structures is greater than a second threshold voltage associated with the second set of GAA structures.

4. The semiconductor device of claim 3, wherein the first threshold voltage is greater than the second threshold voltage by an amount in a range of approximately 10 millivolts to approximately 50 millivolts.

5. The semiconductor device of claim 2, wherein the first set of source/drains are disposed to a first depth of the semiconductor device that is less than a second depth of the second set of source/drains, and
    wherein the second depth is in a range of approximately 105% of the first depth to approximately 130% of the first depth.

6. The semiconductor device of claim 1, wherein the second gate pitch is in a range of approximately 105% of the first gate pitch to approximately 140% of the first gate pitch.

7. The semiconductor device of claim 1, wherein one or more of:
the second source/drain width is greater than the first source/drain width by an amount in a range of approximately 5% to approximately 40%.

8. The semiconductor device of claim 1, wherein the second source/drain width is greater than the first source/drain width, and
wherein a first resistance associated with the first set of source/drains is greater than a second resistance associated with the second set of source/drains.

9. The semiconductor device of claim 8, wherein the second resistance is in a range of approximately 90% of the first resistance to approximately 50% of the first resistance.

10. The semiconductor device of claim 1, wherein the second spacer width is greater than the first spacer width, and
wherein the second spacer width is greater than the first spacer width by an amount in a range of approximately 10% to approximately 100%.

11. The semiconductor device of claim 1, wherein the second spacer width is greater than the first spacer width, and
wherein a first capacitance associated with the first set of top spacers and corresponding first gate contacts is greater than a second capacitance associated with the second set of top spacers and corresponding second gate contacts.

12. The semiconductor device of claim 11, wherein the second capacitance is in a range of approximately 90% of the first capacitance to approximately 50% of the first capacitance.

13. The semiconductor device of claim 1, wherein the first set of GAA structures includes a first set of dielectric structures, disposed between gate structures within the first set of GAA structures, including a first dielectric material having a first dielectric thickness,
wherein the second set of GAA structures includes a second set of dielectric structures, disposed between gate structures within the second set of GAA structures, including a second dielectric material having a second dielectric thickness, and
wherein the first dielectric material is a same material as the second dielectric material and the first dielectric thickness is approximately a same thickness as the second dielectric thickness.

14. A semiconductor device, comprising:
a first set of gate-all-around (GAA) structures having a first gate pitch, the first set of GAA structures including:
a first set of source/drains having a first doping concentration, and
a first set of top spacers, having a first spacer width, disposed between a first set of gates of the first set of GAA structures and the first set of source/drains; and
a second set of GAA structures having a second gate pitch that is a same gate pitch as the first gate pitch, the second set of GAA structures including:
a second set of source/drains having a second doping concentration that is greater than the first doping concentration, and
a second set of top spacers, having a second spacer width, disposed between a second set of gates of the second set of GAA structures and the second set of source/drains.

15. The semiconductor device of claim 14, wherein the first set of source/drains has a first source/drain width, and
wherein the second set of source/drains has a second source/drain width that is greater than the first source/drain width.

16. The semiconductor device of claim 14, wherein a first gate width of the first set of GAA structures is greater than a second gate width of the second set of GAA structures by an amount in a range of approximately 5% to approximately 40%.

17. The semiconductor device of claim 14, wherein the first set of GAA structures includes a first set of dielectric structures, disposed between gate structures within the first set of GAA structures, including a first dielectric material having a first dielectric thickness,
wherein the second set of GAA structures includes a second set of dielectric structures, disposed between gate structures within the second set of GAA structures, including a second dielectric material having a second dielectric thickness, and
wherein the first dielectric material is a same material as the second dielectric material and the first dielectric thickness is approximately a same thickness as the second dielectric thickness.

18. A semiconductor device, comprising:
a first set of gate-all-around (GAA) structures having a first gate pitch, the first set of GAA structures including:
a first set of source/drains having a first doping concentration, and
a first set of top spacers, having a first spacer width, disposed between a first set of gates of the first set of GAA structures and the first set of source/drains; and
a second set of GAA structures having a second gate pitch that is a greater than the first gate pitch, the second set of GAA structures including:
a second set of source/drains having a second doping concentration that is greater than the first doping concentration, and
a second set of top spacers, having a second spacer width, disposed between a second set of gates of the second set of GAA structures and the second set of source/drains.

19. The semiconductor device of claim 18, wherein:
the first set of source/drains have a first source/drain width; and
the second set of source/drains have a second source/drain width.

20. The semiconductor device of claim 19, wherein the second gate pitch is greater than the first gate pitch based on one or more of:
the second source/drain width being greater than the first source/drain width, or
the second spacer width being greater than the first spacer width.

* * * * *